United States Patent
Derner et al.

(10) Patent No.: US 11,574,668 B2
(45) Date of Patent: Feb. 7, 2023

(54) APPARATUSES AND METHODS INCLUDING FERROELECTRIC MEMORY AND FOR OPERATING FERROELECTRIC MEMORY

(71) Applicant: MICRON TECHNOLOGY, INC., Boise, ID (US)

(72) Inventors: Scott J. Derner, Boise, ID (US); Christopher J. Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/451,100

(22) Filed: Oct. 15, 2021

(65) Prior Publication Data
US 2022/0036936 A1 Feb. 3, 2022

Related U.S. Application Data

(63) Continuation of application No. 16/952,439, filed on Nov. 19, 2020, now Pat. No. 11,205,468, which is a
(Continued)

(51) Int. Cl.
*G11C 11/22* (2006.01)
*H01L 27/11514* (2017.01)
*H01L 27/11509* (2017.01)

(52) U.S. Cl.
CPC ........ *G11C 11/2257* (2013.01); *G11C 11/221* (2013.01); *G11C 11/2259* (2013.01);
(Continued)

(58) Field of Classification Search
None
See application file for complete search history.

(56) References Cited

U.S. PATENT DOCUMENTS

| 4,103,342 A | 7/1978 | Miersch et al. |
| 4,853,893 A | 8/1989 | Eaton, Jr. et al. |
(Continued)

FOREIGN PATENT DOCUMENTS

| CN | 1211040 A | 3/1999 |
| CN | 1310448 A | 8/2001 |
(Continued)

OTHER PUBLICATIONS

U.S. Appl. No. 16/569,646 titled "Apparatuses and Methods Including Ferroelectric Memory and for Operating Ferroelectric Memory" filed Sep. 12, 2019, pp. all pages of application as filed.
(Continued)

*Primary Examiner* — Tan T. Nguyen
(74) *Attorney, Agent, or Firm* — Dorsey & Whitney LLP

(57) ABSTRACT

Apparatuses and methods are disclosed that include ferroelectric memory and for operating ferroelectric memory. An example apparatus includes a capacitor having a first plate, a second plate, and a ferroelectric dielectric material. The apparatus further includes a first digit line and a first selection component configured to couple the first plate to the first digit line, and also includes a second digit line and a second selection component configured to couple the second plate to the second digit line.

20 Claims, 12 Drawing Sheets

Related U.S. Application Data continuation of application No. 16/569,646, filed on Sep. 12, 2019, now Pat. No. 10,885,964, which is a continuation of application No. 16/058,202, filed on Aug. 8, 2018, now Pat. No. 10,418,083, which is a continuation of application No. 15/679,016, filed on Aug. 16, 2017, now Pat. No. 10,074,414.

(60) Provisional application No. 62/381,879, filed on Aug. 31, 2016.

(52) U.S. Cl.
CPC ...... *G11C 11/2273* (2013.01); *G11C 11/2293* (2013.01); *H01L 27/11514* (2013.01); *G11C 11/2275* (2013.01); *H01L 27/11509* (2013.01)

(56) References Cited

U.S. PATENT DOCUMENTS

| | | |
|---|---|---|
| 4,873,664 A | 10/1989 | Eaton, Jr. |
| 4,888,733 A | 12/1989 | Mobley et al. |
| 5,218,566 A | 6/1993 | Papaliolios |
| 5,241,503 A | 8/1993 | Cheng |
| 5,307,304 A | 4/1994 | Saito |
| 5,309,391 A | 5/1994 | Papaliolios |
| 5,350,705 A | 9/1994 | Brassington et al. |
| 5,373,463 A | 12/1994 | Jones, Jr. et al. |
| 5,381,364 A | 1/1995 | Chern et al. |
| 5,392,234 A | 2/1995 | Hirano et al. |
| 5,400,275 A | 3/1995 | Abe et al. |
| 5,539,279 A | 7/1996 | Takeuchi et al. |
| 5,541,872 A | 7/1996 | Lowrey et al. |
| 5,598,366 A | 1/1997 | Kraus et al. |
| 5,617,349 A | 4/1997 | Koike |
| 5,627,390 A | 5/1997 | Maeda et al. |
| 5,675,530 A | 10/1997 | Hirano et al. |
| 5,798,964 A | 8/1998 | Shimizu et al. |
| 5,889,695 A | 3/1999 | Kawagoe |
| 5,889,696 A | 3/1999 | Kawakubo et al. |
| 5,912,846 A | 6/1999 | Taylor |
| 5,917,746 A | 6/1999 | Seyyedy |
| 5,959,922 A | 9/1999 | Jung |
| 5,995,407 A | 11/1999 | Kamp |
| 6,028,783 A | 2/2000 | Allen et al. |
| 6,028,784 A | 2/2000 | Mori et al. |
| 6,034,884 A | 3/2000 | Jung |
| 6,038,160 A | 3/2000 | Nakane et al. |
| 6,072,711 A | 6/2000 | Kang |
| 6,147,895 A | 11/2000 | Kamp |
| 6,154,387 A | 11/2000 | Takata |
| 6,198,654 B1 | 3/2001 | Ashikaga |
| 6,229,730 B1 | 5/2001 | Kato |
| 6,317,356 B1 | 11/2001 | Hoffmann et al. |
| 6,363,002 B1 | 3/2002 | Nishimura et al. |
| 6,363,003 B1 | 3/2002 | Miyamoto |
| 6,483,737 B2 | 11/2002 | Takeuchi et al. |
| 6,538,914 B1 | 3/2003 | Chung |
| 6,687,151 B2 | 2/2004 | Endo et al. |
| 6,807,082 B2 | 10/2004 | Aoki et al. |
| 6,961,271 B2 | 11/2005 | Jeon et al. |
| 7,154,767 B2 | 12/2006 | Sakuma |
| 7,200,026 B2 | 4/2007 | Yamamura |
| 9,514,797 B1 | 12/2016 | Chu et al. |
| 10,074,414 B2 | 9/2018 | Derner et al. |
| 10,127,965 B2 | 11/2018 | Kawamura et al. |
| 10,127,972 B2 | 11/2018 | Kawamura et al. |
| 10,153,018 B2 | 12/2018 | Derner et al. |
| 10,354,712 B2 | 7/2019 | Derner et al. |
| 10,418,083 B2 | 9/2019 | Derner et al. |
| 10,431,283 B2 | 10/2019 | Kawamura et al. |
| 10,854,276 B2 | 12/2020 | Kawamura et al. |
| 10,867,675 B2 | 12/2020 | Derner et al. |
| 10,872,650 B2 | 12/2020 | Derner et al. |
| 10,885,964 B2 | 1/2021 | Derner et al. |
| 10,998,031 B2 | 5/2021 | Kawamura et al. |
| 11,107,515 B2 | 8/2021 | Derner et al. |
| 11,205,468 B2 | 12/2021 | Derner et al. |
| 2001/0041438 A1 | 11/2001 | Maeda et al. |
| 2001/0053087 A1 | 12/2001 | Kato et al. |
| 2002/0043676 A1 | 4/2002 | Ohtsuka et al. |
| 2002/0044477 A1 | 4/2002 | Takeuchi et al. |
| 2002/0176274 A1 | 11/2002 | Ashikaga |
| 2003/0053326 A1 | 3/2003 | Murakuki |
| 2003/0117832 A1 | 6/2003 | Tomishima |
| 2003/0147269 A1 | 8/2003 | Nishihara |
| 2003/0173604 A1 | 9/2003 | Aoki et al. |
| 2003/0185040 A1 | 10/2003 | Riekes et al. |
| 2003/0185041 A1 | 10/2003 | Takahashi et al. |
| 2003/0206430 A1 | 11/2003 | Ho |
| 2004/0013017 A1 | 1/2004 | Takashima |
| 2004/0090813 A1 | 5/2004 | Park |
| 2004/0095799 A1 | 5/2004 | Jacob et al. |
| 2004/0105296 A1 | 6/2004 | Tom |
| 2004/0119105 A1 | 6/2004 | Wilson |
| 2004/0125642 A1 | 7/2004 | Oikawa et al. |
| 2004/0184298 A1 | 9/2004 | Takahashi et al. |
| 2005/0012125 A1 | 1/2005 | Summerfelt et al. |
| 2005/0012130 A1 | 1/2005 | Forbes |
| 2005/0032301 A1 | 2/2005 | Udayakumar et al. |
| 2005/0122763 A1 | 6/2005 | Yamamura |
| 2005/0128784 A1 | 6/2005 | Kawashima et al. |
| 2005/0146918 A1 | 7/2005 | Ogiwara et al. |
| 2006/0083049 A1 | 4/2006 | Chandler et al. |
| 2006/0215472 A1 | 9/2006 | Yoon et al. |
| 2006/0221746 A1 | 10/2006 | Kang et al. |
| 2006/0268596 A1 | 11/2006 | Yamaoka et al. |
| 2006/0285378 A1 | 12/2006 | Yamaoka et al. |
| 2007/0058414 A1 | 3/2007 | Hoya et al. |
| 2007/0115711 A1 | 5/2007 | Shore et al. |
| 2007/0133258 A1 | 6/2007 | Kim |
| 2007/0228434 A1 | 10/2007 | Shimojo |
| 2008/0061333 A1 | 3/2008 | Hidaka |
| 2008/0265300 A1 | 10/2008 | Akiyama et al. |
| 2009/0010037 A1 | 1/2009 | Kang et al. |
| 2009/0231902 A1 | 9/2009 | Takashima |
| 2009/0273963 A1 | 11/2009 | Nagai |
| 2010/0052023 A1 | 3/2010 | Kanaya |
| 2010/0165704 A1 | 7/2010 | Wu et al. |
| 2010/0321975 A1 | 12/2010 | Kimura et al. |
| 2011/0128769 A1 | 6/2011 | Kimura |
| 2011/0199811 A1 | 8/2011 | Kanno et al. |
| 2012/0033483 A1 | 2/2012 | Koyama |
| 2012/0074466 A1 | 3/2012 | Setiadi et al. |
| 2012/0113707 A1* | 5/2012 | Takemura ............... G11C 11/40 365/149 |
| 2012/0127776 A1 | 5/2012 | Kawashima |
| 2012/0170348 A1 | 7/2012 | Clinton et al. |
| 2012/0170349 A1 | 7/2012 | Clinton et al. |
| 2012/0307545 A1 | 12/2012 | McAdams et al. |
| 2013/0094274 A1 | 4/2013 | Kaneko |
| 2013/0229849 A1 | 9/2013 | Kawashima |
| 2014/0036567 A1 | 2/2014 | Fukuzumi et al. |
| 2015/0355886 A1 | 12/2015 | Peeters et al. |
| 2018/0061468 A1 | 3/2018 | Derner et al. |
| 2018/0061469 A1 | 3/2018 | Derner et al. |
| 2018/0061471 A1 | 3/2018 | Kawamura et al. |
| 2018/0061477 A1 | 3/2018 | Kawamura et al. |
| 2018/0358083 A1 | 12/2018 | Kawamura et al. |
| 2018/0374528 A1 | 12/2018 | Derner et al. |
| 2019/0005999 A1 | 1/2019 | Derner et al. |
| 2019/0013057 A1 | 1/2019 | Kawamura et al. |
| 2019/0019553 A1 | 1/2019 | Derner et al. |
| 2019/0295623 A1 | 9/2019 | Derner et al. |
| 2020/0005850 A1 | 1/2020 | Derner et al. |
| 2020/0005853 A1 | 1/2020 | Kawamura et al. |
| 2020/0357454 A1 | 11/2020 | Derner et al. |
| 2021/0074345 A1 | 3/2021 | Derner et al. |
| 2021/0074357 A1 | 3/2021 | Derner et al. |

FOREIGN PATENT DOCUMENTS

| | | |
|---|---|---|
| CN | 1343008 A | 4/2002 |
| CN | 1383210 A | 12/2002 |

(56) References Cited

FOREIGN PATENT DOCUMENTS

| | | |
|---|---|---|
| CN | 1519940 A | 8/2004 |
| CN | 1532842 A | 9/2004 |
| CN | 1612264 A | 5/2005 |
| CN | 1666293 A | 9/2005 |
| CN | 1695200 A | 11/2005 |
| CN | 1806294 A | 7/2006 |
| CN | 1812105 A | 8/2006 |
| CN | 103578534 A | 2/2014 |
| CN | 105742486 A | 7/2016 |
| EP | 0359404 A2 | 3/1990 |
| JP | 02113496 A | 4/1990 |
| JP | H0541502 A | 2/1993 |
| JP | 06125066 A | 5/1994 |
| JP | 1995321228 | 12/1995 |
| JP | H07321228 A | 12/1995 |
| JP | 1996124379 A | 5/1996 |
| JP | H08124379 A | 5/1996 |
| JP | 08-171793 A | 7/1996 |
| JP | H10320981 A | 12/1998 |
| JP | 11-354727 A | 12/1999 |
| JP | 2000156472 A | 6/2000 |
| JP | 2000187989 A | 7/2000 |
| JP | 2002124081 A | 4/2002 |
| JP | 2003228977 A | 8/2003 |
| JP | 2005223137 A | 8/2005 |
| JP | 2006339194 A | 12/2006 |
| JP | 2007116180 A | 5/2007 |
| JP | 2007122874 A | 5/2007 |
| JP | 2007266494 A | 10/2007 |
| KR | 100201735 B1 | 6/1999 |
| KR | 20010047661 A | 6/2001 |
| KR | 20030066378 A | 8/2003 |
| KR | 1020050107819 | 11/2005 |
| KR | 20060017579 A | 2/2006 |
| KR | 20140117902 A | 10/2014 |
| KR | 1020140117902 | 10/2014 |
| TW | 201712910 A | 4/2017 |
| WO | 9914761 A1 | 3/1999 |
| WO | 0219341 A2 | 3/2002 |
| WO | 2004109705 A2 | 12/2004 |
| WO | 2007094133 A1 | 8/2007 |
| WO | 2018044485 A1 | 3/2018 |
| WO | 2018044486 A1 | 3/2018 |
| WO | 2018044487 A1 | 3/2018 |
| WO | 2018044510 A1 | 3/2018 |
| WO | 2019014271 A1 | 1/2019 |

OTHER PUBLICATIONS

U.S. Appl. No. 16/569,588 titled "Apparatuses and Methods Including Ferroelectric Memory and for Accessing Ferroelectric Memory" filed Sep. 12, 2019, pp. all pages of application as filed.
U.S. Appl. No. 16/937,402, titled "Ferroelectric Memory Cells", dated Jul. 23, 2020, pp. all pages of application as filed.
U.S. Appl. No. 16/952,439 titled "Apparatuses and Methods Including Ferroelectric Memory and for Operating Ferroelectric Memory" filed Nov. 19, 2020, pp. all pages of application as filed.
U.S. Appl. No. 16/953,092 titled "Apparatuses and Methods for Memory Including Ferroelectric Memory Cells and Dielectric Memory Cells" filed Nov. 19, 2020, pp. all pages of application as filed.
EESR dated May 4, 2020 for EP Application No. 17847173.6, 9 pgs.
First Office Action dated Feb. 12, 2018 for Taiwanese Application No. 106128400, pp. all.
International Preliminary Report on Patentability dated Mar. 14, 2019 for PCT Application No. PCT/US2017/045175, 9 pages.
International Search Report and Written Opinion dated Nov. 29, 2017 for PCT Application No. PCT/US2017/045175, pp. all.
JP Office Action dated May 26, 2020 for JP Application No. 2019-511354, 5, pgs.
KR Office Action dated Jun. 17, 2020 for KR Application No. 10-2019-7009021, 3 pgs.
KR Office Action dated Sep. 25, 2020 for KR Application No. 10-2019-7009021, pp. all.
PCT Application No. PCT/US2018/041513, titled "Apparatuses and Methods for Memory Including Ferroelectric Memory Cells and Dielectric Memory Cells" filed on Jul. 10, 2018, pp. all pages of application as filed.
U.S. Appl. No. 16/425,769 titled "Ferroelectric Memory Cells" filed May 29, 2019, pp. all pages of application as filed.
U.S. Appl. No. 15/678,978, entitled "Ferroelectric Memory Cells", filed Aug. 16, 2017, pp. all pages of application as filed.
U.S. Appl. No. 15/679,016, entitled "Apparatuses and Methods Including Ferroelectric Memory and for Operating Ferroelectric Memory", filed Aug. 16, 2017, pp. all pages of application as filed.
U.S. Appl. No. 15/679,032, entitled "Apparatuses and Methods Including Ferroelectric Memory and for Accessing Ferroelectric Memory", filed Aug. 16, 2017, pp. all pages of application as filed.
U.S. Appl. No. 15/679,042, entitled "Apparatuses and Methods Including Two Transistor-One Capacitor Memory and for Accessing Same", filed Aug. 16, 2017, pp. all pages of application as filed.
U.S. Appl. No. 16/058,202 titled "Apparatuses and Methods Including Ferroelectric Memory and for Operating Ferroelectric Memory" filed Aug. 8, 2018, pp. all pages of application as filed.
U.S. Appl. No. 16/131,969, titled "Apparatuses and Methods Including Ferroelectric Memory and for Accessing Ferroelectric Memory", filed Sep. 14, 2018, pp. all pages of application as filed.
U.S. Appl. No. 16/005,493, titled "Apparatuses and Methods for Memory Including Ferroelectric Memory Cells and Dielectric Memory Cells", filed Jun. 11, 2018, pp. all pages of application as filed.
International Preliminary Report on Patentability for PCT Application No. PCT/US2017/045175 dated Mar. 14, 2019, pp all.
U.S. Appl. No. 16/104,709 titled "Ferroelectric Memory Cells", filed Aug. 17, 2018, pp. all pages of application as filed.
U.S. Appl. No. 16/105,631 titled "Apparatuses and Methods Including Two Transistor-One Capacitor Memory and for Accessing Same", filed Aug. 20, 2018, pp. all pages of application as filed.
Henkels, W.H. et al., "Large-Signal 2T, 1C DRAM Cell: Signal and Layout Analysis", IEEE Journal of Solid-State Circuits, vol. 29, No. 7, Jul. 1994, 4 pages.

* cited by examiner

APPARATUSES AND METHODS INCLUDING FERROELECTRIC MEMORY AND FOR OPERATING FERROELECTRIC MEMORY

CROSS-REFERENCE TO RELATED APPLICATION

This application is a continuation of pending U.S. patent application Ser. No. 16/952,439 filed Nov. 19, 2020, which is a continuation of U.S. patent application Ser. No. 16/569, 646 filed Sep. 12, 2019 and issued as U.S. Pat. No. 10,885, 964 on Jan. 5, 2021, which is a continuation of U.S. patent application Ser. No. 16/058,202 filed Aug. 8, 2018 and issued as U.S. Pat. No. 10,418,083 on Sep. 17, 2019, which is a continuation of U.S. patent application Ser. No. 15/679, 016 filed Aug. 16, 2017 and issued as U.S. Pat. No. 10,074, 414 on Sep. 11, 2018, which claims the benefit of U.S. Provisional Application No. 62/381,879, filed Aug. 31, 2016. The aforementioned applications, and issued patents, are incorporated by reference herein in their entirety and for all purposes.

BACKGROUND

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM). dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. It is desirable, however, to improve the operation of FeRAM devices. For example, it may be desirable to have improved noise resistance during memory cell sensing, more compact circuits and reduced layout size, and improved timing for operation of FeRAM devices.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
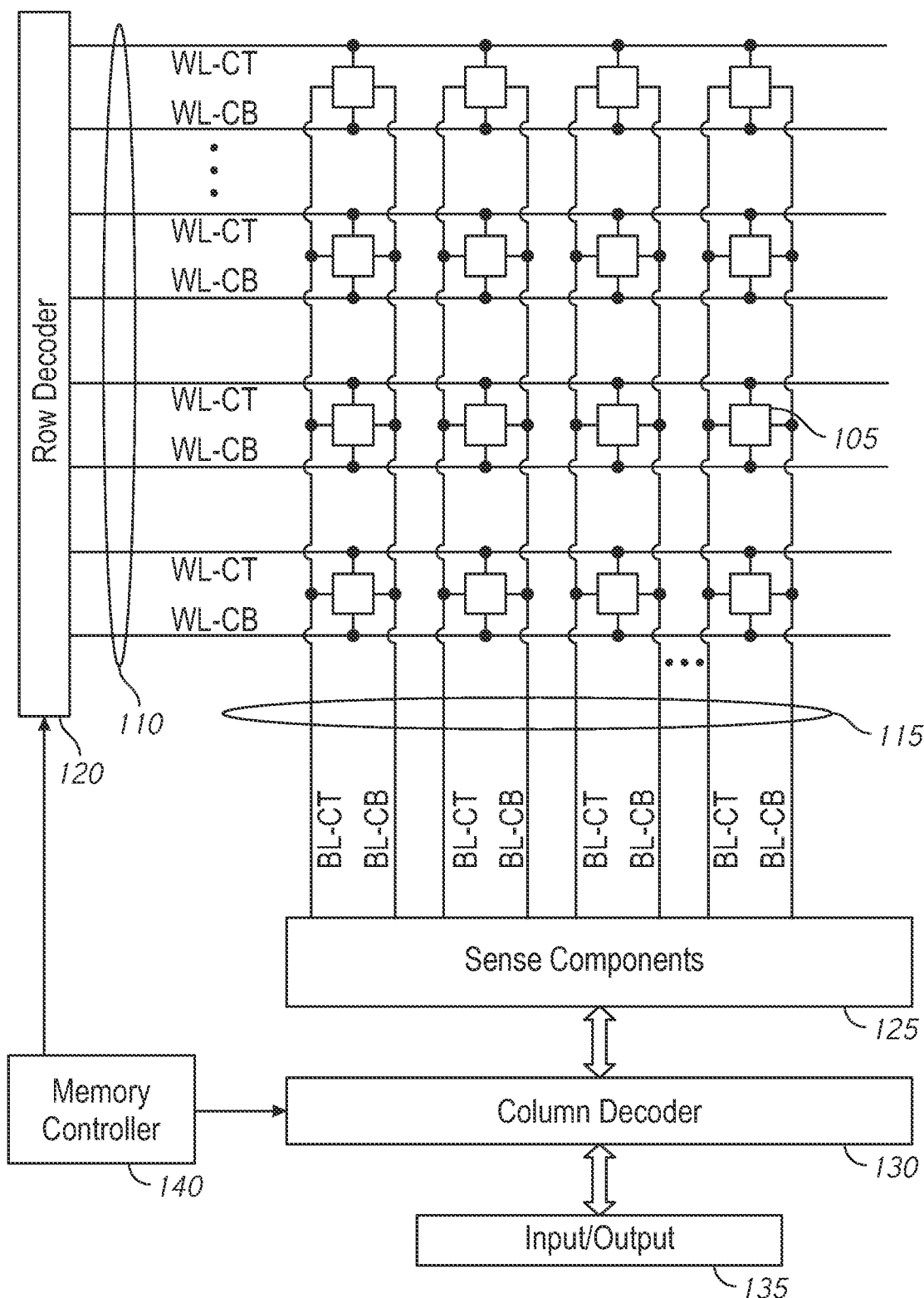
FIG. 1 is a block diagram of an example memory array that supports ferroelectric memory in accordance with various embodiments of the present disclosure.

FIG. 1 illustrates an example memory array 100 that supports ferroelectric memory in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In sonic cases, memory cell 105 is configured to store more than two logic states. A memory cell 105 may include a capacitor to store a charge representative of the programmable states. For example, a charged and uncharged capacitor may represent two logic states, respectively.

A ferroelectric memory cell may include a capacitor that has a ferroelectric as the dielectric material. Different levels of charge of a ferroelectric capacitor may represent different logic states. Ferroelectric memory cells 105 may have beneficial properties that may result in improved performance relative to other memory architectures, for example, persistent storage of logic states without the need for periodic refresh operations.

Operations such as reading and writing may be performed on memory cells 105 by activating or selecting the appropriate access lines 110 and digit lines 115. Access lines 110 may also be referred to as word lines 110. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, doped semiconductors, other conductive materials, or the like. According to the example of FIG. 1, each row of memory cells 105 is coupled to word lines 110 WL-CT and WL-CB, and each column of memory cells 105 is coupled to digit lines 115 BL-CT and BL-CB. By activating the respective word lines 110 and digit lines 115 (e.g., applying a voltage to the word lines 110 or digit lines 115), a memory cell 105 may be accessed at their intersection. Accessing the memory cell 105 may include reading or writing the memory cell 105. The intersection of a word lines 110 and digit lines 115 may be referred to as an address of a memory cell.

In some architectures, the logic storing device of a cell, e.g., a capacitor, may be electrically isolated from the digit lines by selection components. A word line 110 may be coupled to and may control a respective selection component. For example, the selection component may be a transistor and the word line 110 may be coupled to the gate of the transistor. Activating the word line 110 results in an electrical coupling or closed circuit between the capacitor of a memory cell 105 and corresponding digit line 115. The digit lines may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word lines 110 based on the received row address. Similarly, a column decoder 130 receives a column address from the memory controller 140 and activates the appropriate digit lines 115. For example, memory array 100 may include multiple word lines 110, and multiple digit lines 115. Thus, by activating word lines 110 WL-CT and WL-CB and digit lines 115 BL-CT and BL-CB, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto corresponding digit lines 115. Discharging the ferroelectric capacitor may be based on biasing, or applying a voltage, to the ferroelectric capacitor. The discharging may cause a change in the voltage of the digit lines 115, which sense component 125 may compare to a reference voltage (not shown) in order to determine the stored state of the memory cell 105. For example, if a digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. A separate sense component 125 may be provided for each pair of digit lines BL-CT and BL-CB. The detected logic state of memory cell 105 may then be output through column decoder 130 as output 135.

A memory cell 105 may be programmed, or written, by activating the relevant word lines 110 and digit lines 115. As discussed above, activating word lines 110 electrically couples the corresponding row of memory cells 105 to their respective digit lines 115. By controlling the relevant digit lines 115 while the word lines 110 are activated, a memory cell 105 may be written e.g., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state, and re-write or refresh operations may be performed to return the original logic state to memory cell 105. For example, the capacitor may be partially or completely discharged during a sense operation, corrupting the stored logic state. So the logic state may be re-written after a sense operation. Additionally, activating word lines 110 may result in the discharge of all memory cells in the row. Thus, several or all memory cells 105 in the row may need to be re-written.

The memory controller 140 may control the operation (e.g., read, write, re-write, etc.) of memory cells 105 through the various components, such as row decoder 120, column decoder 130, and sense component 125. Memory controller 140 may generate row and column address signals in order to activate the desired word lines 110 and digit lines 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously. For example, multiple or all cells of memory array 100 may be accessed simultaneously during a reset operation in which all memory cells 105, or a group of memory cells 105, are set to a single logic state.

Figure 2A:
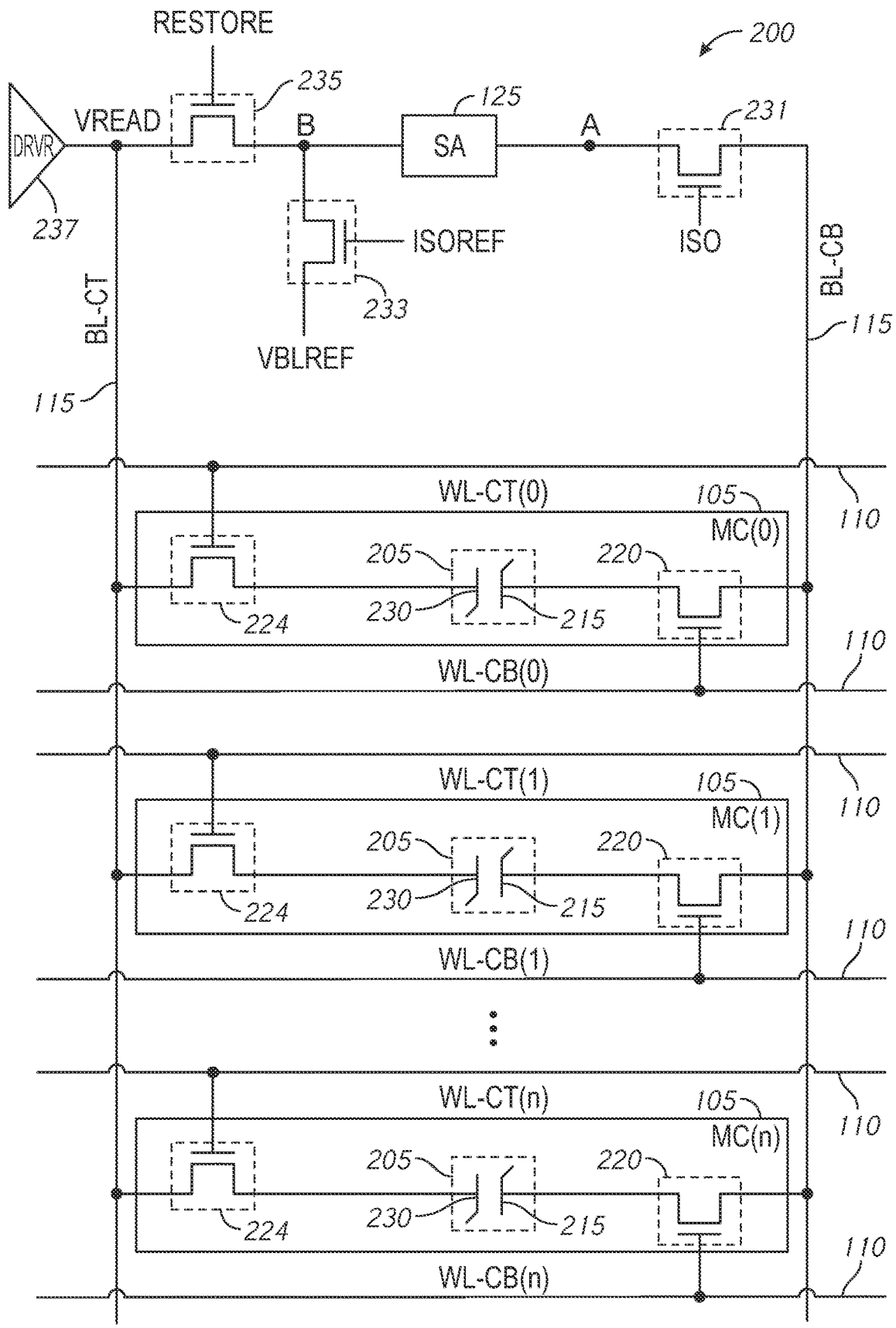
FIG. 2A is a schematic diagram of an example circuit that includes a column of memory cells according to an embodiment of the present disclosure.

FIG. 2A illustrates an example circuit 200 that includes a column of memory cells according to an embodiment of the present disclosure. FIG. 2A illustrates an example circuit 200 that includes memory cells 105 in accordance with various embodiments of the present disclosure. Circuit 200 includes memory cells 105 MC(0)-MC(n), where "n" depends on the array size. The circuit 200 further includes word lines WL-CT(0)-WL-CT(n) and WL-CB(0)-WL-CB(n), digit lines BL-CT and BL-CB, and sense component 125, The word lines, digit lines, and sense component may be examples of memory cells 105, word lines 110, digit lines 115, and sense component 125, respectively, as described with reference to FIG. 1. While one column of memory cells 105 is shown in FIG. 2A, a memory array may include a plurality of columns of memory cells as those shown.

Memory cells 105 may include a logic storage component, such as capacitor 205 that has a first plate, cell top 230, and a second plate, cell bottom 215. Cell tops 230 and cell bottoms 215 may be capacitively coupled through a ferroelectric material positioned between them. The orientation of cell tops 230 and cell bottoms 215 may be flipped without changing the operation of memory cell 105. The memory cells 105 may further include selection components 220 and 224. The selection components 220 and 224 may be transistors, for example, n-type field effect transistors. In such an example, each of the memory cells 105 includes two transistors and one capacitor.

Circuit 200 also includes isolation switch 231 and reference switch 233. A reference signal VBLREF is provided to the reference switch 233. The isolation switch 231 is coupled to a sense node A of the sense component 125 and the reference switch 233 is coupled to a sense node B of the sense component 125. Activation of the isolation switch 231 is controlled by a signal ISO and activation of the reference switch 233 is controlled by a signal ISOREF. Circuit 200 also includes switch 235 and driver circuit 237. In some examples, switch 235 may be a transistor, for example, an n-type field effect transistor, and may be activated by applying a voltage equal to or greater than its threshold voltage. Activation of the switch 235 is controlled by a signal RESTORE. The driver circuit 237 provides a VREAD voltage when activated.

Memory cells 105 may be in electronic communication with sense component 125 through digit line BL-CT and digit line BL-CB. The switch 235 may be coupled in series between the sense component 125 and the digit line BL-CT and the driver circuit 237. The switch 235 electrically couples or isolates the sense component 125 from the memory cells 105 and the driver circuit 237, In the example of FIG. 2A, cell tops 230 may be accessed via digit line BL-CT and cell bottoms may be accessed via digit line BL-CB. As described above, various states may be stored by charging or discharging capacitor 205.

The stored state of capacitor 205 may be read or sensed by operating various elements represented in circuit 200. Capacitor 205 may be in electronic communication with digit lines BL-CB and BL-CT. For example, capacitor 205 can be isolated from digit lines BL-CB and BL-CT when selection components 220 and 224 are deactivated, and capacitor 205 can be coupled to digit lines BL-CB and BL-CT when selection components 220 and 224 are activated. Activating selection components 220 and 224 may be referred to as selecting memory cell 105, in some cases, selection components 220 and 224 are transistors and the operation is controlled by applying voltages to the transistor gates, where the voltage magnitude is greater than the threshold voltage of the transistors. Word line WL-CB may activate selection component 220 and word line WL-CT may activate selection component 224. For example, a voltage applied to word line WL-CB is applied to the transistor gate of selection component 220 and a voltage applied to word line WL-CT is applied to the transistor gate of selection component 224. As a result, the respective capacitor 205 is coupled with digit lines BL-CB and BL-CT, respectively. The memory cell 105 may be considered in storage mode when both word lines WL-CB and WL-CT are deactivated. The memory cell 105 may also be considered in storage mode when both word lines WL-CB and WL-CT are activated and the voltages of the digit lines BL-CB and BL-CT are the same.

Word lines WL-CB(0)-WL-CB(n) and WL-CT(0)-WL-CT(n) are in electronic communication with selection components 220 and 224 of memory cells 105 MC(0)-MC(n), respectively. Thus, activating word lines WL-CB and WL-CT of a respective memory cell 105 may activate the memory cell 105. For example, activating WL-CB(0) and WL-CT(0) activates memory cell MC(0), activating WL-CB(1) and WL-CT(1) activates memory cell MC(1), and so on. In some examples, the positions of selection components 220 and 224 may be switched, such that selection component 220 is coupled between digit line BL-CT and cell top 230, and the selection component 224 is coupled between digit line BL-CB and cell bottom 215.

Due to the ferroelectric material between the plates of capacitor 205, and as discussed in more detail below, capacitor 205 may not discharge upon coupling to digit lines BL-CB and BL-CT. To sense the logic state stored by ferroelectric capacitor 205, word lines WL-CB and WL-CT may be biased to select a respective memory cell 105, and a voltage may be applied to the digit line BL-CT, for example, by driver circuit 237. The digit line BL-CT bias may be applied before or after activating selection component 224. Biasing the digit line BL-CT may result in a voltage difference across capacitor 205, which may yield a change in the stored charge on capacitor 205. The magnitude of the change in stored charge may depend on the initial state of each capacitor 205 e.g., whether the initial state stored a logic 1 or a logic 0. When the selection component 220 is activated by the word line WL-CB, the change in stored charge may cause a change in the voltage of digit line BL-CB based on the charge stored on capacitor 205. The resulting voltage of digit line BL-CB may be compared to a reference (e.g., a voltage of the VBLREF signal) by the sense component 125 in order to determine the stored logic state in each memory cell 105.

Sense component 125 may include various transistors or amplifiers to detect and amplify a difference in signals, which may be referred to as latching. Sense component 125 may include a sense amplifier that receives and compares the voltage of digit line BL-CB and the voltage of the reference signal VBLREF, which may be a reference voltage. The sense amplifier output may be driven to the higher (e.g., a positive) or lower (e.g., negative or ground) supply voltage based on the comparison. For instance, if digit line BL-CB has a higher voltage than reference signal VBLREF, then the sense amplifier output may be driven to a positive supply voltage. In some cases, the sense amplifier may additionally drive digit line BL-CB to the supply voltage and drive the digit line BL-CT to the negative or ground voltage. Sense component 125 may then latch the output of the sense amplifier and/or the voltage of digit line BL-CB, which may be used to determine the stored state in memory cell 105, e.g., logic 1. Alternatively, if digit line BL-CB has a lower voltage than reference signal VBLREF, the sense amplifier output may be driven to a negative or ground voltage. In some cases, the sense amplifier may additionally drive digit line BL-CB to the negative or ground voltage and drive the digit line BL-CT to the supply voltage. Sense component 125 may similarly latch the sense amplifier output to determine the stored state in memory cell 105, e.g., logic 0. The latched logic state of memory cell 105 may then be output, for example, through column decoder 130 as output 135 with reference to FIG. 1. In embodiments where the sense component 125 drives the digit lines BL-CB and BL-CT to complementary voltages (e.g., the supply voltage is complementary to the negative or ground voltage, and the negative or ground voltage is complementary to the supply voltage), the complementary voltage may be applied to the memory cell 105 to restore the original data state read. By restoring the data, a separate restore operation is unnecessary.

As previously described, the digit lines BL-CB and BL-CT and the selection components 220 and 224 provide independent control of cell bottom 215 and cell top 230 of the capacitor 205, thus, removing the need for a shared cell plate, as is typical with conventional ferroelectric memories. As a result, the cells may be less susceptible to disturb mechanisms, for example, cell plate related pattern noise. Additionally, cell plate driver circuits, which are needed for shared cell plate designs, are not needed which can reduce circuit size. The digit lines of the plurality of columns of memory cells may be driven to voltages independently of one another. For example, the digit line BL-CT (the digit line coupled through a selection component to the cell top, which is opposite of the cell bottom) of a first column of memory cells may be driven to a voltage independently of the voltage to which the digit line BL-CT of a second column of memory cells are driven.

Figure 2B:
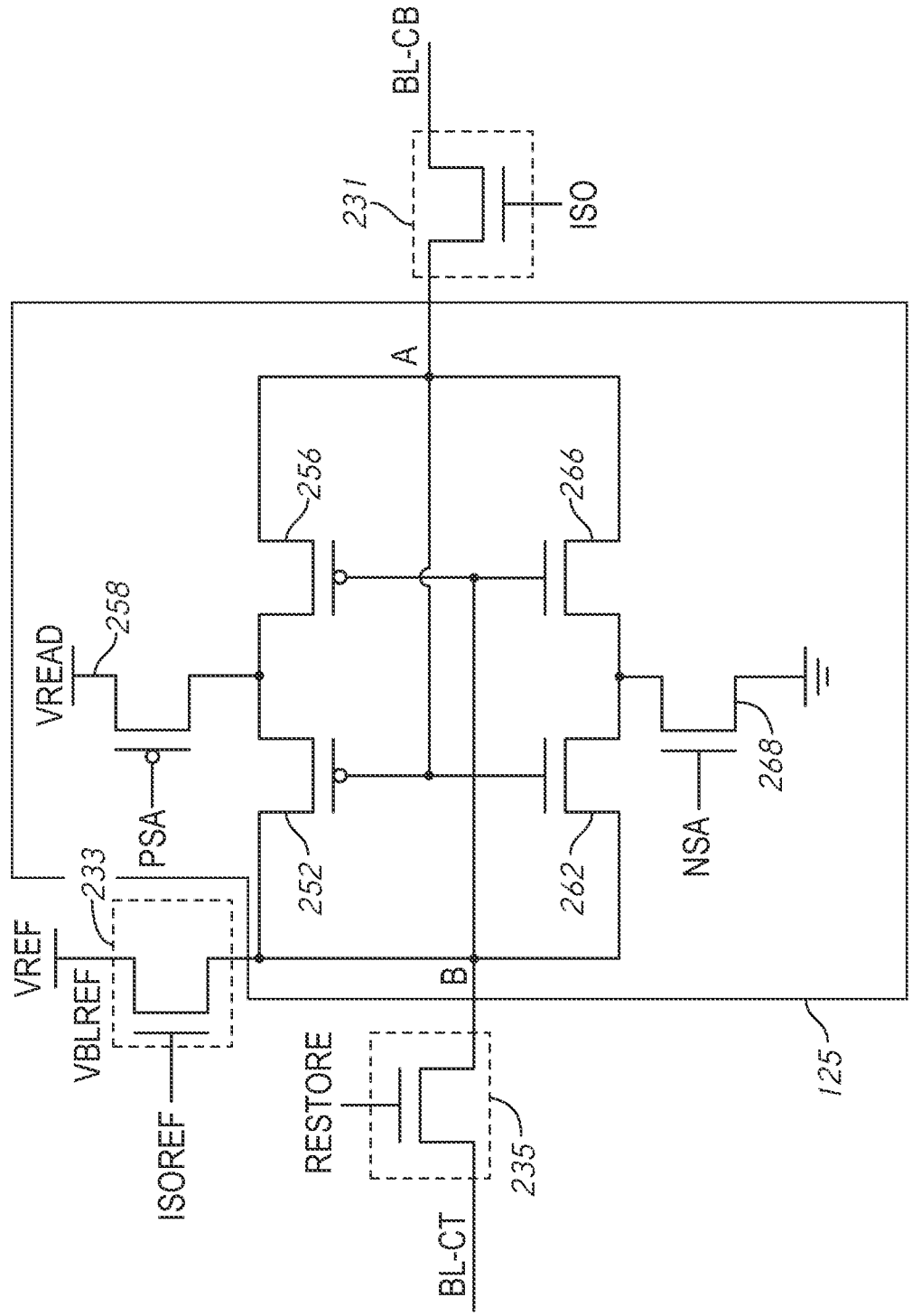
FIG. 2B is a schematic diagram of a sense component according to an embodiment of the disclosure.

FIG. 2B illustrates a sense component 125 according to an embodiment of the disclosure. The sense component 125 includes p-type field effect transistors 252 and 256 and n-type field effect transistors 262 and 266. Gates of the transistor 252 and transistor 262 are coupled to sense node A. Gates of the transistor 256 and transistor 266 are coupled to sense node B. The transistors 252 and 256, and the transistors 262 and 266 represent a sense amplifier. A p-type field effect transistor 258 is configured to be coupled to a power supply (e.g., VREAD oltage power supply) and is coupled to a common node of the transistors 252 and 256. The transistor 258 is activated by an active PSA signal (e.g., active low logic). An n-type field effect transistor 268 is configured to be coupled to a reference voltage (e.g., ground) and is coupled to a common node of the transistors 262 and 266. The transistor 268 is activated by an active NSA signal (e.g., active high logic).

In operation, the sense amplifier is activated by activating the PSA and NSA signals to couple the sense amplifier to the voltage of the power supply and the reference voltage. When activated, the sense amplifier compares the voltages of sense nodes A and B, and amplifies a voltage difference by driving the sense nodes A and B to complementary voltage levels (e.g., driving sense node A to VREAD and sense node B to ground, or driving sense node A to ground and sense node B to VREAD), When the sense nodes A and B have been driven to the complementary voltage levels, the states of sense nodes A and B are latched by the sense amplifier and remain latched until the sense amplifier is deactivated.

With reference to FIG. 2A, to write memory cell 105, a voltage may be applied across capacitor 205. Various methods may be used. In some examples, selection components 220 and 224 may be activated through word lines WL-CB and WL-CT, respectively, in order to electrically couple capacitor 205 to digit lines BL-CB and BL-CT. For a ferroelectric capacitor 205, a voltage may be applied across capacitor 205 by controlling the voltage of cell top 230 (through digit line BL-CT) and cell bottom 215 (through digit line BL-CB) to apply a positive or negative voltage across the capacitor 205.

In some examples, a write-back operation may be performed after sensing. As previously discussed, the sense operation may degrade or destroy the originally stored logic value of the memory cell 105. After sensing, the detected logic value may be written back to the memory cell 105. For example, sense component 125 may determine the logic state of memory cell 105 and may then write the same logic state back, for example, through isolation switch 231 and switch 235.

Figure 3A:
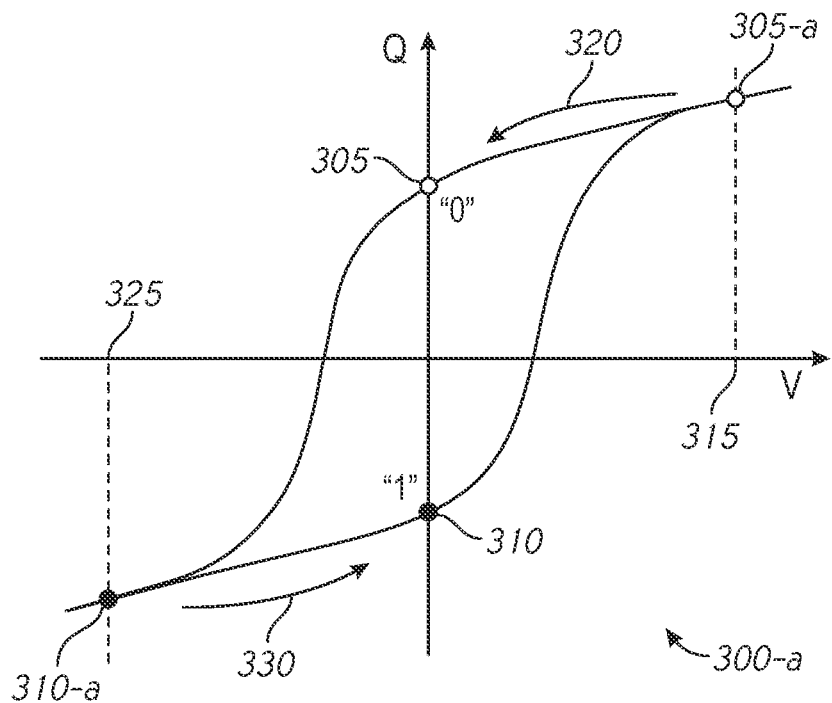
FIG. 3A and FIG. 3B are diagrams of example non-linear electrical properties for a ferroelectric memory cell in accordance with various embodiments of the present disclosure.
Figure 3B:
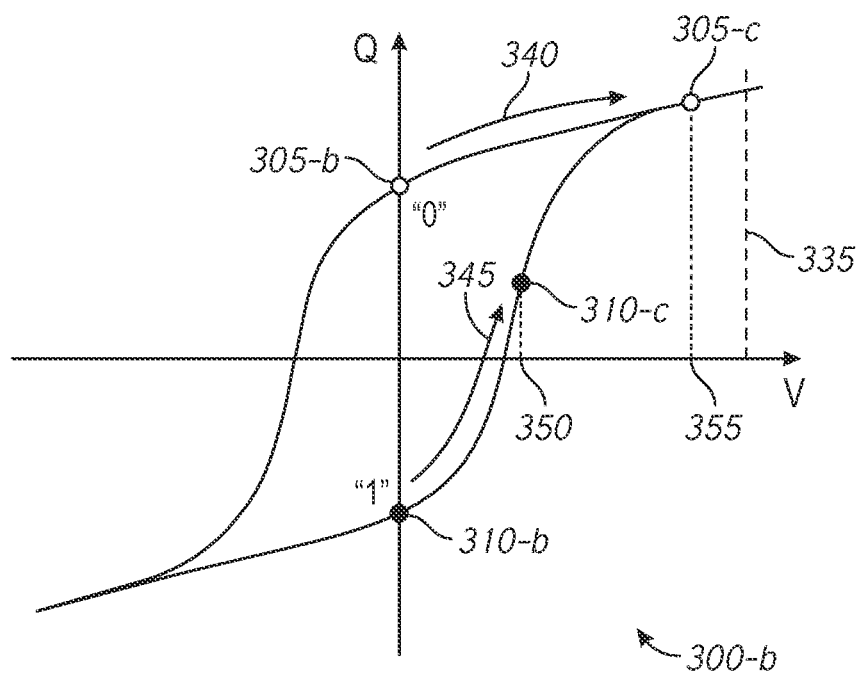

Ferroelectric materials have non-linear polarization properties. FIG. 3A and FIG. 3B illustrate examples of non-linear electrical properties with hysteresis curves 300-a (FIG. 3A) and 300-b (FIG. 3B) for a memory cell for ferroelectric memory in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2A) as a function of a voltage difference, V.

A ferroelectric material is characterized by a spontaneous electric polarization, for example, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectic capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in volatile memory arrays. This may reduce the need to perform refresh operations as described above for some volatile memory architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell top 230) and maintaining the second terminal (e.g., a cell bottom 215) at ground (or approximately zero volts (0V)). A negative voltage may be applied by maintaining the terminal in question at ground and applying a positive voltage to the second terminal, for example, positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, which is the polarization (or charge) that remains upon removing the external bias (e.g., voltage).

To read, or sense, the stored state of the ferroelectric capacitor, a voltage may be applied across the capacitor. In response, the stored charge, Q, changes, and the degree of the change depends on the initial charge state, and as a result, the final stored charge (Q) depends on whether charge state 305-b or 310-b was initially stored. For example, hysteresis curve 300-b illustrates two possible stored charge states 305-*b* and 310-*b*. Voltage 335 may be applied across the capacitor as previously discussed. Although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line coupled to the memory cell. For example, if the capacitor is electrically coupled to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis. Charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355 (e.g., voltage 335–voltage 350) or (e.g., voltage 335–voltage 355). A reference voltage may be generated such that its magnitude is between the two possible digit line voltages in order to determine the stored logic state, for example, if the digit line voltage is higher or lower than the reference voltage. For example, the reference voltage may be an average of the two quantities (voltage 335-voltage 350) and (voltage 335-voltage 355). Upon comparison by the sense component, the sensed digit line voltage may be determined to be higher or lower than the reference voltage, and the stored logic value of the ferroelectric memory cell (e.g., a logic 0 or 1) may be determined.

Figure 4A:
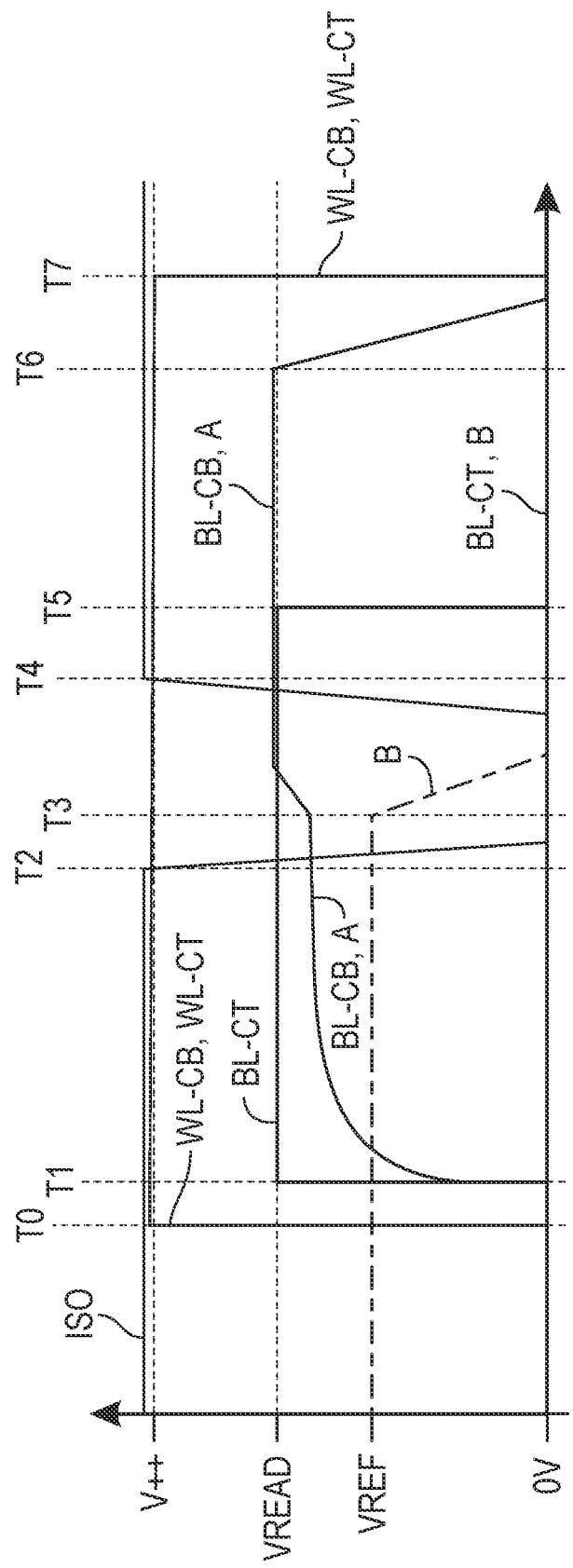
FIG. 4A is a timing diagram of various signals during a read operation according to an embodiment of the disclosure.

FIG. 4A is a timing diagram of various signals during a read operation according to an embodiment of the disclosure. FIG. 4A will be described with reference to memory array 100 and example circuit 200 of FIGS. 1 and 2. The data state stored by the memory cell 105 in the example read operation of FIG. 4A is a logic "1".

Prior to time T0, the digit lines BL-CB and BL-CT are at a reference voltage, for example, ground, and the switch 235 is deactivated. Also prior to time T0, the reference switch 233 is activated by the ISOREF signal to set the voltage of sense node B to the VREF voltage of the reference signal VBLREF. The isolation switch 231 is activated by the ISO signal to set the voltage of sense node A to ground by being coupled to the digit line BL-CB.

At time T0, the word lines WL-CB and WL-CT are activated to activate selection components 220 and 224, respectively, of a memory cell 105 being accessed. As a result, the digit line BL-CB is coupled to cell bottom 215 and the digit line BL-CT is coupled to cell top 230 of the capacitor 205. At time T1, the driver circuit 237 is activated to provide a voltage VREAD to the cell top 230 over the digit line BL-CT and through the selection component 224. The voltage VREAD is coupled through the capacitor 205 from the cell top 230 to cause a voltage change at the cell bottom 215. As previously discussed, the magnitude of the change in voltage caused at the cell bottom 215 is based at least in part on the charge state initially stored by the capacitor. With the charge state of the present example of FIG. 4A corresponding to a logic 1, the voltage at cell bottom 215 due to voltage VREAD is greater than the VREF voltage of the reference signal VBLREF. The voltage of the cell bottom 215 is coupled to the sense node A of the sense component 125 through selection component 220, over digit line BL-C13, and through isolation switch 231.

In some embodiments, the timing of the signals may be different than that specifically shown in FIG. 4A. For example, the word line WL-CT may be activated prior to activating the word line WL-CB. In another example, the VREAD voltage is provided to the cell top 230 prior to activation of the word line WL-CB. Other signal timings may be used as well in other embodiments to couple the cell top to the digit line BL-CT and couple the cell bottom to the digit line BL-CB, provide the VREAD voltage to the cell top 230, and cause a voltage change at the cell bottom 215 that is provided to the sense node A of the sense component 125.

At time T2, the ISO signal deactivates the isolation switch 231 and the reference switch 233 is deactivated to isolate the sense nodes A and B of the sense component 125. The sense component 125 is activated at time T3 to compare the voltage of sense node A (the voltage of the cell bottom 215 responsive to the VREAD voltage) with the voltage of sense node B (the voltage of the cell top 230 at the VREF voltage of the reference signal VBLREF). Due to the voltage of sense node A being greater than the voltage of the reference signal VBLREF of sense node B, the sense component 125 drives sense node A to the VREAD voltage and drives sense node B to ground. The VREAD voltage at sense node A represents the logic 1 state read from the memory cell 105. While not shown in FIG. 4A, the detected logic state of memory cell 105 may then be output through column decoder 130 as output 135 (FIG. 1). The isolation switch 231 is activated at time T4 by the ISO signal to couple sense node A to digit line BL-CB.

At time T5, the driver circuit 237 is deactivated to no longer provide the VREAD voltage, and the switch 235 is activated by the RESTORE signal (not shown) to couple sense node B to the digit line BL-CT. As a result, the digit line BL-CT is driven to ground, and consequently, the cell top 230 is also driven to ground. Conversely, the digit line BL-CB is driven to the VREAD voltage through the isolation switch 231, and consequently, the cell bottom 215 is also driven to the VREAD voltage. The activation of the switch 235 restores the charge on the capacitor 205 to ensure that the read operation does not change or degrade the logic 1 state stored by the memory cell 105.

The sense component 125 is deactivated at time T6 and the voltage of sense node A (and the voltage of digit line BL-CB) changes to ground, and the word lines WL-CB and WL-CT are deactivated at time T7 to deactivate the selection components 220 and 224 to isolate the capacitor 205 from the digit lines BL-CB and BL-CT, all respectively, to complete the read operation.

Figure 4B:
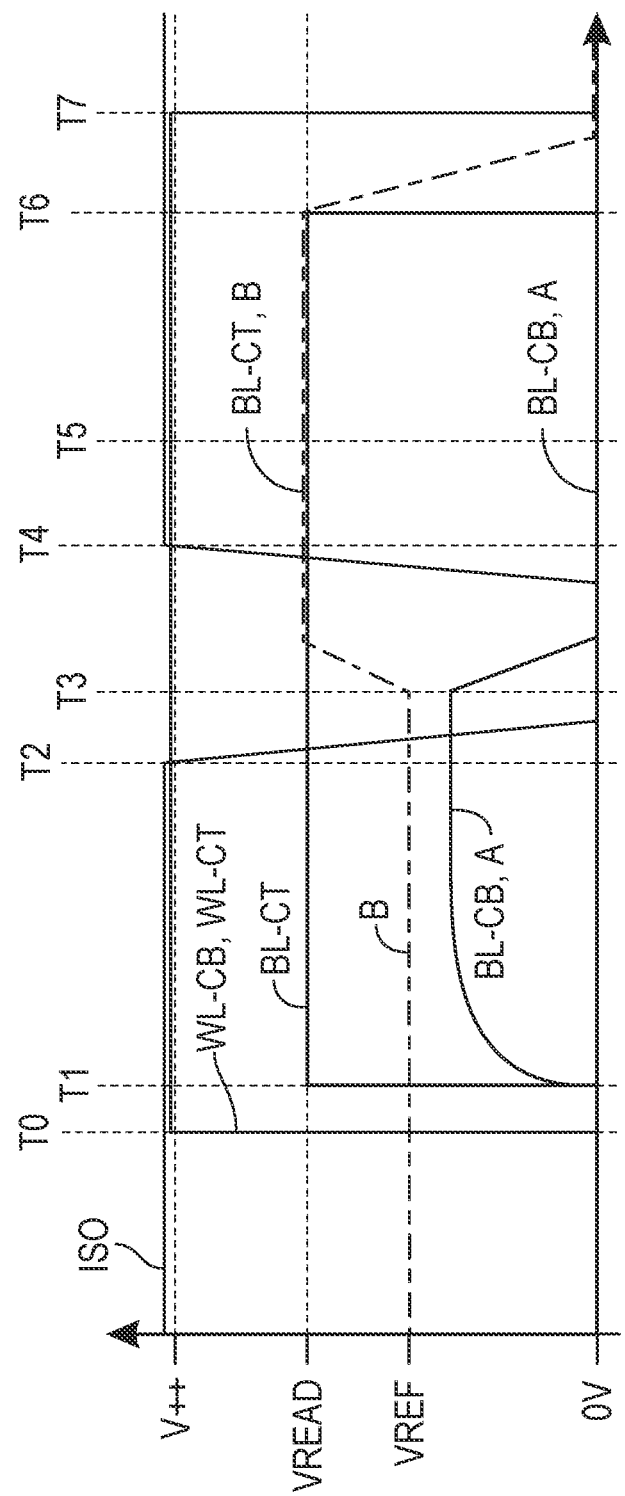
FIG. 4B is a timing diagram of various signals during a read operation according to an embodiment of the disclosure.

FIG. 4B is a timing diagram of various signals during a read operation according to an embodiment of the disclosure. FIG. 4B will be described with reference to memory array 100 and example circuit 200 of FIGS. 1 and 2. The data state stored by the memory cell 105 in the example read operation of FIG. 4B is a logic "0".

Prior to time T0, the digit lines BL-CB and BL-CT are at a reference voltage, for example, ground, and the switch 235 is deactivated. Also prior to time T0, the reference switch 233 is activated by the ISOREF signal to set the voltage of sense node B to the VREF voltage of the reference signal VBLREF. The isolation switch 231 is activated by the ISO signal to set the voltage of sense node A to ground by being coupled to the digit line BL-CB.

At time T0, the word lines WL-CB and WL-CT are activated to activate selection components 220 and 224, respectively, of a memory cell 105 being accessed. As a result, the digit line BL-CB is coupled to cell bottom 215 and the digit line BL-CT is coupled to cell top 230 of the capacitor 205. At time T1, the driver circuit 237 is activated to provide a voltage VREAD to the cell top 230 over the digit line BL-CT and through the selection component 224. The voltage VREAD is coupled through the capacitor 205 from the cell top 230 to cause a voltage change at the cell bottom 215 and causes a change in voltage. In contrast with the example read operation for logic 1 of FIG. 4A, as a result of the charge state of the present example of FIG. 4B corresponding to a logic 0, the voltage at cell bottom 215 due to voltage VREAD is less than the VREF voltage of the reference signal VBLREF. The voltage of the cell bottom 215 is coupled to the sense node A of the sense component 125 through selection component 220, over digit line BL-CB, and through isolation switch 231. As with the example read operation of FIG. 4A, in some embodiments, the timing of the signals may be different than that specifically shown in FIG. 4B.

At time T2, the ISO signal deactivates the isolation switch 231 and the reference switch 233 is deactivated to isolate the sense nodes A and B of the sense component 125. The sense component 125 is activated at time 13 to compare the voltage of sense node A (the voltage of the cell bottom 215 responsive to the VREAD voltage) with the voltage of sense node B (the voltage of the cell top 230 at the VREF voltage of the reference signal VBLREF). Due to the voltage of sense node A being less than the voltage of the reference signal VBLREF of sense node B, the sense component 125 drives sense node A to ground and drives sense node B to the VREAD voltage. The ground voltage of sense node A represents the logic 0 state read from the memory cell 105. While not shown in FIG. 4B, the detected logic state of memory cell 105 may then be output through column decoder 130 as output 135 (FIG. 1). The isolation switch 231 is activated at time T4 by the ISO signal to couple sense node A to digit line BL-CB.

At time T5, the driver circuit 237 is deactivated to no longer provide the VREAD voltage, and the switch 235 is activated by the RESTORE signal (not shown) to couple sense node B to the digit line BL-CT. As a result, the digit line BL-CT is driven to the VREAD voltage, and consequently, the cell top 230 is also driven to the VREAD voltage. Conversely, the digit line BL-CB is driven to ground through the isolation switch 231, and consequently, the cell bottom 215 is also driven to ground. The activation of the switch 235 restores the charge on the capacitor 205 to ensure that the read operation does not change or degrade the logic 0 state stored by the memory cell 105.

The sense component 125 is deactivated at time 16. The voltage of the sense node B (and the digit line BL-CT) changes to ground and the voltage of sense node A (and the digit line BL-CB) remains at ground. The word lines WL-CB and WL-CT are deactivated at time T7 to deactivate the selection components 220 and 224 to isolate the capacitor 205 from the digit lines BL-CB and BL-CT, all respectively, to complete the read operation.

Figure 5A:
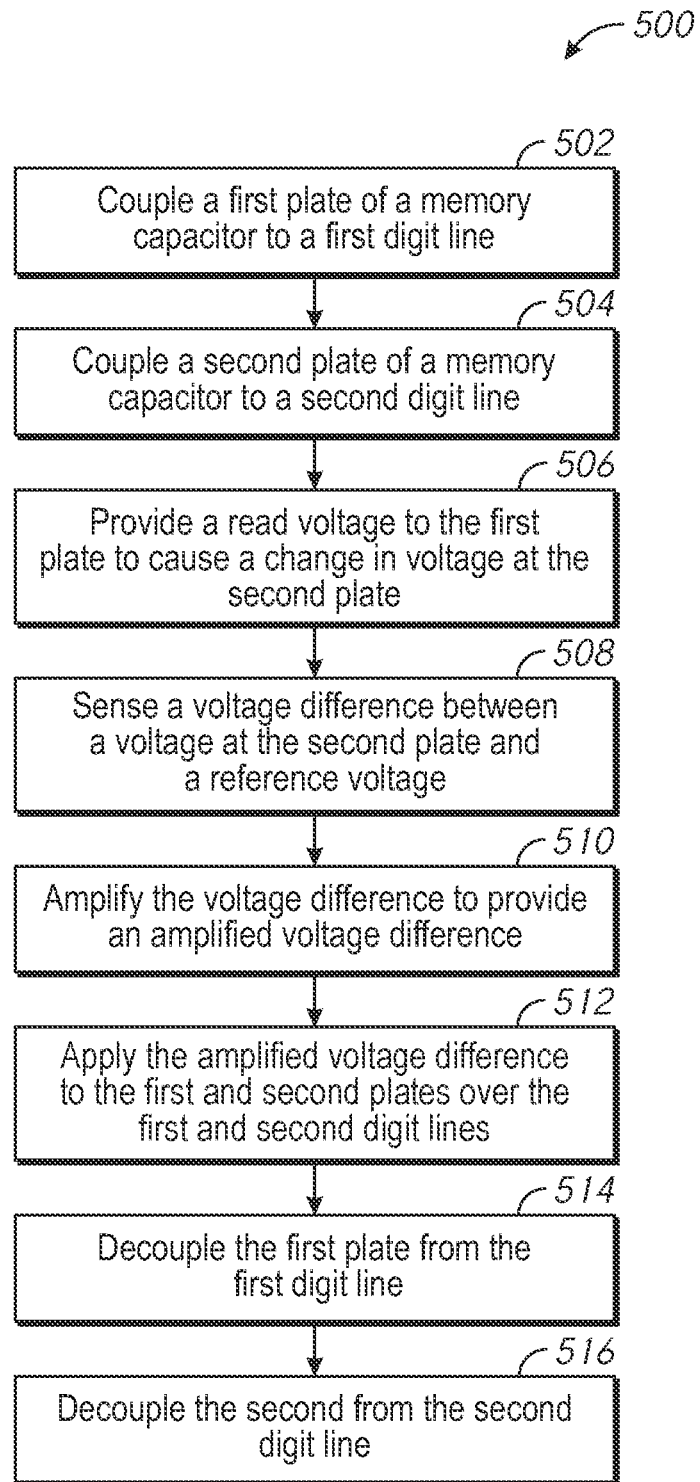
FIG. 5A is a flow diagram of a read operation according to an embodiment of the disclosure.

FIG. 5A is a flow diagram for a method 500 according to an embodiment of the invention. The method 500 may be used to read a memory cell, for example, memory cell 105 previously discussed. FIG. 5A will be described with reference to memory array 100 and example circuit 200 of FIGS. 1 and 2.

The method 500 includes coupling a first plate of a memory capacitor to a first digit line at step 502 and coupling a second plate of the memory capacitor to a second digit line at step 504. For example, coupling the cell top 230 to the digit line BL-CT and coupling the cell bottom 215 to the digit line BL-CB. Selection components 220 and 224 may be used to couple the cell bottom 215 and cell top 230 to the digit lines BL-CB and BL-CT, respectively. The coupling of the cell bottom 215 to the digit line BL-CB and coupling the cell top 230 to the digit line BL-CB may be concurrent in some embodiments. In other embodiments, the coupling of the cell bottom 215 to the digit line BL-CB and coupling the cell top 230 to the digit line BL-CT may not be concurrent.

A read voltage is provided at step 506 to the first plate of the memory capacitor to cause a change in voltage at the second plate of the memory capacitor. An example read voltage is VREAD provided to the cell top 230. At step 508 a voltage difference is sensed between a voltage at the second plate of the memory capacitor and a reference voltage, and the voltage difference is amplified at step 510 to provide an amplified voltage difference. With reference to FIGS. 1 and 2, the sense component 125 senses a voltage difference between a voltage of the cell top 230 and a reference voltage, such as the reference signal VBLREF, and the sense component 125 amplifies the voltage difference , for example, by driving an output to a supply and/or reference voltage, As previously discussed, in some embodiments, the sense nodes A and B of the sense component 125 are driven to complementary voltage levels (e.g., driving sense node A to VREAD and sense node B to ground responsive to a voltage of the cell bottom 215 being greater than the voltage of the reference signal VBLREF, or driving sense node A to ground and sense node B to VREAD responsive to a voltage of the cell bottom 215 being less than the voltage of the reference signal VBLREF).

The amplified voltage difference is applied at step 512 to the first and second plates of the memory capacitor over the first and second digit lines, respectively. The first plate of the memory capacitor is decoupled from the first digit line at step 514 and the second plate of the memory capacitor is decoupled from the second digit line at step 516. For example, with reference to FIGS. 1 and 2, the amplified voltage difference is applied to the cell top 230 and cell bottom 215 through the digit lines BL-CT and BL-CB, respectively. The selection component 22.4 may be used to decouple the digit line BL-CT from the cell top 230 and the selection component 220 may be used to decouple the digit line BL-CB from the cell bottom 215.

Figure 5B:
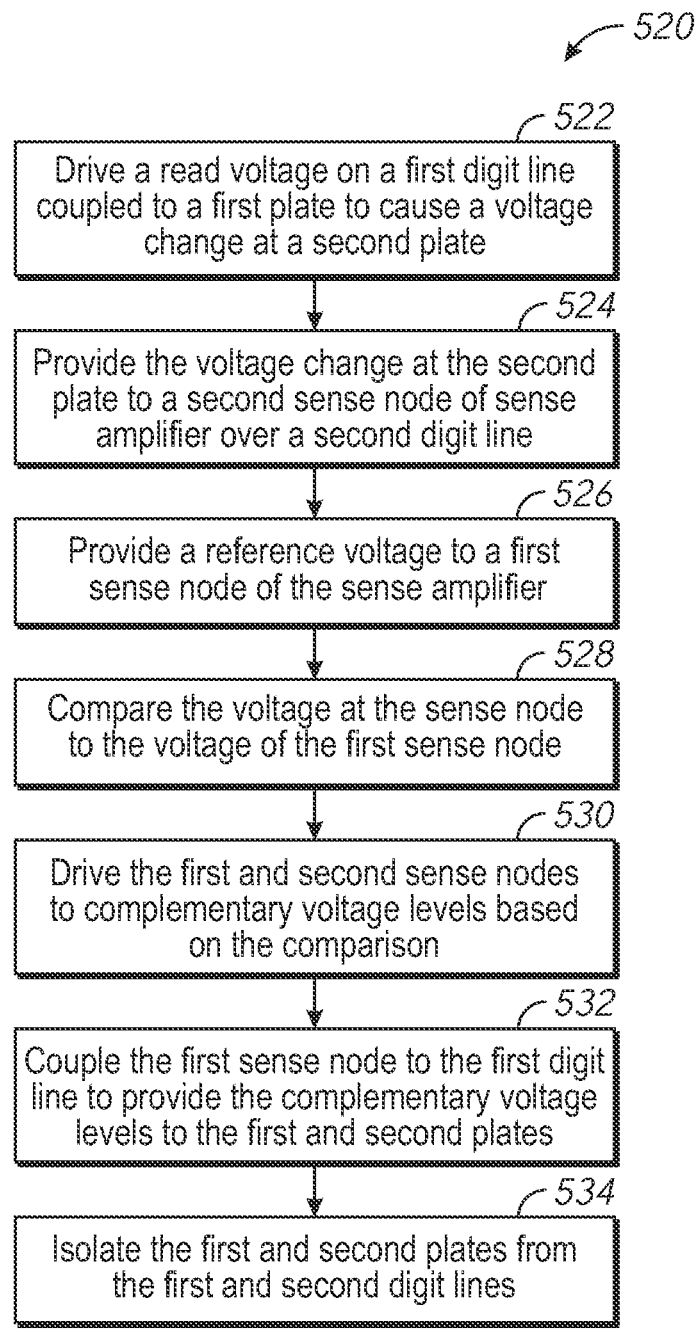
FIG. 5B is a flow diagram of a read operation according to another embodiment of the disclosure.

FIG. 5B is a flow diagram for a method 520 according to an embodiment of the invention, The method 520 may be used to read a memory cell, for example, memory cell 105 previously discussed. FIG. 5B will be described with reference to memory array 100 and example circuit 200 of FIGS. 1 and 2.

The method 520 includes driving a read voltage on a first digit line coupled to a first plate of a ferroelectric memory cell at step 522 to cause a voltage change at a second plate of the ferroelectric memory cell. For example, a read voltage VREAD may be driven on the digit line BL-CT, which may be coupled through the selection component 224 to the cell top 230. The voltage change at the second plate of the ferroelectric memory cell is provided at step 524 to a second sense node of a sense amplifier over a second digit line coupled to the second plate of the ferroelectric memory cell. As previously discussed, the cell bottom 215 may experience a voltage change due to the VREAD voltage, and the voltage change may be provided to the sense node A of the sense component 125.

A reference voltage, such as the reference signal VBLREF, is provided at step 526 to a first node of a sense amplifier and the voltage at the second sense node of the sense amplifier is compared to the voltage of the first sense node at step 528. The first and second sense nodes are driven to complementary voltage levels based on the comparison at step 530. With reference to FIGS. 1 and 2, the sense component 125 may compare the voltages of the sense nodes A and B and drive the sense nodes A and B to complementary voltages, for example, to the VREAD voltage and to ground.

At step 532 the first sense node is coupled to the first digit line to provide the complementary voltage levels to the first and second plates of the ferroelectric memory cell over the first and second digit lines, respectively, and at step 534 the first and second plates are isolated from the first and second digit lines, respectively.

Figure 6:
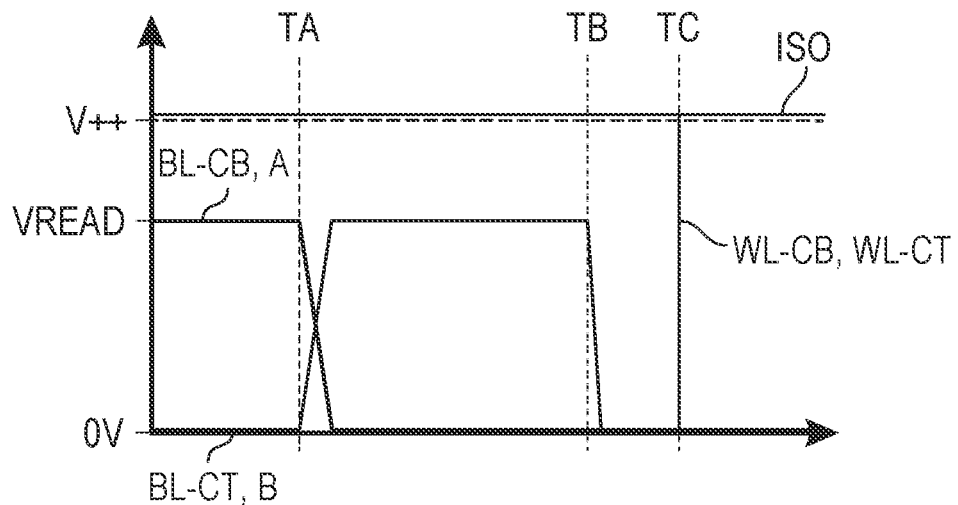
FIG. 6 is a timing diagram of various signals during a write operation according to an embodiment of the disclosure.

FIG. 6 is a timing diagram of various signals during a write operation according to an embodiment of the disclosure. FIG. 6 will be described with reference to memory array 100 and example circuit 200 of FIGS. 1 and 2. In the example write operation of FIG. 6 a logic "0" is written to a memory cell 105 that currently stores a logic "1".

Prior to time TA, the word lines WL-CB and WL-CT are activated to activate selection components 220 and 224, respectively. As a result, the digit line BL-CB is coupled to cell bottom 215 and the digit line BL-CT is coupled to cell top 230 of the capacitor 205. The voltage of the digit line BL-CB is at the VREAD voltage representing the currently stored logic "1" and the voltage of the digit line BL-CT is at a reference voltage, for example, ground. Also prior to time TA, the digit line BL-CB is coupled to sense node A of the sense component 125 through activated isolation switch 231, and the digit line BL-CT is coupled to sense node B of the sense component 125 through activated switch 235. Thus, prior to time TA, the sense nodes A and B are coupled to cell bottom 215 and cell top 230, respectively.

At time TA, a write amplifier (not shown) coupled to sense nodes A and B drives the sense node A from the VREAD voltage to ground and drives sense node B from ground to the VREAD voltage. The voltages of sense nodes A and B are latched by the sense component 125. With the sense nodes A and B driven by the write amplifier, the voltage of the digit line BL-CB changes to ground and the voltage of the digit line BL-CT changes to the VREAD voltage. The ground voltage of the sense node A and the digit line BL-CB represents the logic "0" written to the capacitor 205. The ground voltage of the digit line BL-CB and the VREAD voltage of the digit line BL-CT is applied to the cell bottom 215 and to the cell top 230 through the activated selection component 220 and 224, all espectively. As a result, the capacitor 205 becomes polarized in an opposite polarization to change the stored data from a logic "1" to a logic "0".

By time TB the voltages at the sense nodes A and B have been latched by the sense component 125 and the voltages of the sense nodes A and B are no longer driven by the write amplifier. The sense component 125 is deactivated at time TB and the voltage of the sense node B (and the digit line BL-CT) changes to ground. The word lines WL-CB and WL-CT are deactivated at time TC to complete the write operation.

Figure 7:
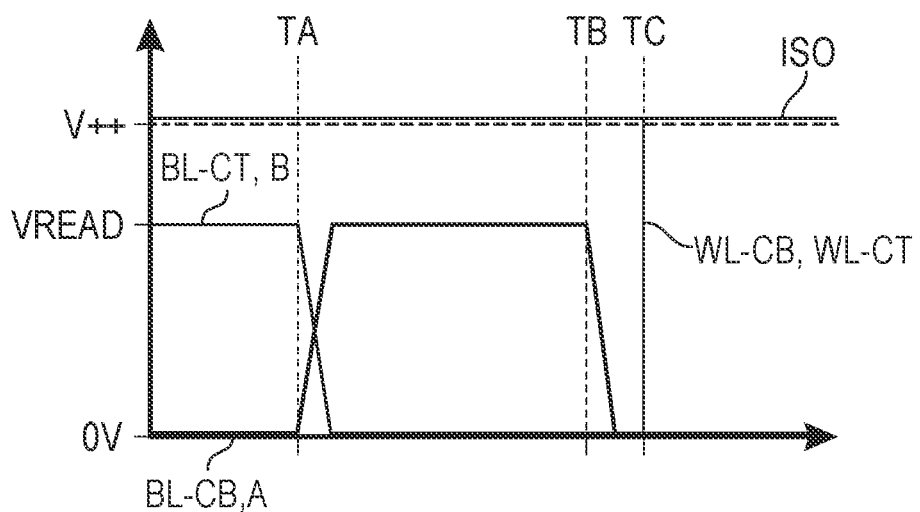
FIG. 7 is a timing diagram of various signals during a write operation according to an embodiment of the disclosure.

FIG. 7 is a timing diagram of various signals during a write operation according to an embodiment of the disclosure. FIG. 7 will be described with reference to memory array 100 and example circuit 200 of FIGS. 1 and 2, In the example write operation of FIG. 7 a logic "1" is written to a memory cell 105 that currently stores a logic "0".

Prior to time TA, the word lines WL-CB and WL-CT are activated to activate selection components 220 and 224, respectively. As a result, the digit line BL-CB is coupled to cell bottom 215 and the digit line BL-CT is coupled to cell top 230 of the capacitor 205. The voltage of the digit line BL-CB is at ground representing the currently stored logic "0" and the voltage of the digit line BL-CT is at the VREAD voltage. Also prior to time TA, the digit line BL-CB is coupled to sense node A of the sense component 125 through activated isolation switch 231, and the digit line BL-CT is coupled to sense node B of the sense component 125 through activated switch 235. Thus, prior to time TA, the sense nodes A and B are coupled to cell bottom 215 and cell top 230, respectively.

At time TA, a write amplifier (not shown) coupled to sense nodes A and B drives the sense node A from ground to the VREAD voltage and drives sense node B from the VREAD voltage to ground. The voltages of sense nodes A and B are latched by the sense component 125. With the sense nodes A and B driven by the write amplifier, the voltage of the digit line BL-CB changes to the VREAD voltage and the voltage of the digit line BL-CT changes ground. The VREAD voltage of the sense node A and the digit line BL-CB represents the logic "1" written to the capacitor 205. The VREAD voltage of the digit line BL-CB and the ground voltage of the digit line BL-CT is applied to the cell bottom 215 and to the cell top 230 through the activated selection component 220 and 224, all respectively. As a result, the capacitor 205 becomes polarized in an opposite polarization to change the stored data from a logic "0" to a logic "1".

By time TB the voltages at the sense nodes A and B have been latched by the sense component 125 and the voltages of the sense nodes A and B are no longer driven by the write amplifier. The sense component 125 is deactivated at time TB and the voltage of the sense node B (and the digit line BL-CT) changes to ground, The word lines WL-CB and WL-CT are deactivated at time TC to complete the write operation.

In some embodiments, the write operations described with reference to FIGS. 6 and 7 may be performed in conjunction with a read operation, for example, read operations described with reference to FIGS. 4A and 4B. For example, with reference to the example read operation of FIG. 4A, the example write operation of FIG. 6 may be performed following activation of the switch 235 at time T5. In another example, with reference to the example read operation of FIG. 4B, the example write operation of FIG. 7 may be performed following activation of the activation of the switch 235 at time T5. The example write operations of FIGS. 6 and 7 may be performed in conjunction with different operations in other embodiments.

As previously described with reference to FIGS. 4A and 4B, a logic "1" is represented by a voltage on the cell bottom greater than the VREF voltage of the reference signal VBLREF, and a logic "0" is represented by a voltage on the cell bottom less than the VREF voltage of the reference signal VBREF. As also previously described with reference to the example write operations of FIGS. 6 and 7 a logic "1" is written by applying the VREAD voltage to the cell bottom and ground to the cell top, and a logic "0" is written by applying ground to the cell bottom and the VREAD voltage to the cell top. In some examples, the logic values corresponding to the voltages relative to the voltage of the VREF reference signal VBLREF, and the application of the net positive/negative voltages for writing the logic values may be reversed without loss of understanding.

The example voltages and signal timing described with reference to the read and write operations of FIGS. 4-7 have been provided for illustrative purposes, and are not intended to limit the scope of the present disclosure. It will be appreciated that the voltages and relative signal timing may be modified without departing from the scope of the present disclosure.

Figure 8:
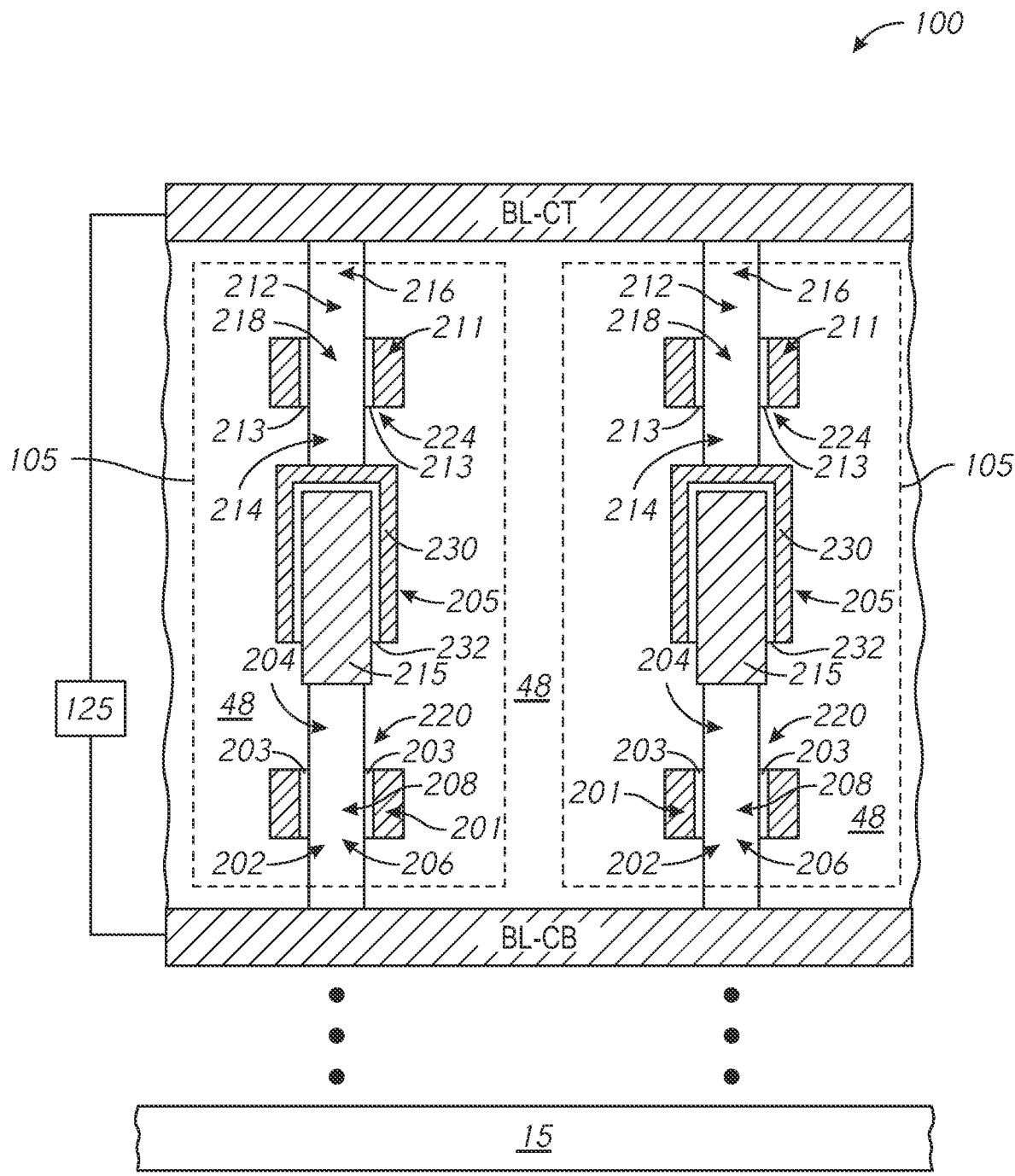
FIG. 8 is a diagram depicting a cross-sectional side view of a portion of a memory array showing memory cells according to an embodiment of the disclosure.

FIG. 8 illustrates a portion of a memory array 100 including an example embodiment of memory cells 105 according to the disclosure.

The illustrated region of memory array 100 includes digit lines BL-CT and BL-CB. The digit lines BL-CT and BL-CB are vertically offset relative to another and may be connected to a sense component 125. A pair of adjacent memory cells 105 are shown, with such adjacent memory cells being in a common column as one another within the memory array (e.g., being along a common column represented by digit lines BL-CT and BL-CB). Insulative mated al 48 is shown to surround the various components of memory cells 105. In some embodiments the memory cells 105 may be referred to as substantially identical memory cells along a column of a memory array, with the term "substantially identical" meaning that the memory cells are identical to one another within reasonable tolerances of fabrication and measurement.

The digit line BL-CB is shown to be over and supported by a base 15. Such base may be a semiconductor material. The memory cells 105 each includes selection components 220 and 224 and a ferroelectric capacitor 205. The capacitor 205 is vertically between the selection components 220 and 224 of memory cell 105. The capacitor 205 includes a first plate, cell top 230, and a second plate, cell bottom 215, and a ferroelectric material 232 disposed between the cell top 230 and the cell bottom 215. Although the cell top 230 is shown to be container-shaped and the cell bottom 215 is shown to extend within such container shape, in other embodiments the cell top and bottom may have other configurations. For instance, the cell top and bottom may have planar configurations. Pillar 212 extends from digit line BL-CT to the cell top 230 of capacitor 205, and the pillar 202. extends from the digit line BL-CB to the cell bottom 215 of capacitor 205.

The selection component 224 has source/drain region 214 extending to the cell top 230 of capacitor 205, and has source/drain region 216 extending to the digit line BL-CT. The selection component 224 also has channel region 218 between the source/drain regions 214 and 216. Gate 211 is along the channel region 218 and offset from the channel regions by gate dielectric material 213. The gate 211 may be included in a word line WL-CT.

The selection component 220 has source/drain region 204 extending to the cell bottom 215 of capacitor 205, and has source/drain region 206 extending to the digit line BL-CB. The selection component 220 also has channel region 208 between the source/drain regions 204 and 206. Gate 201 is along the channel region 208 and offset from the channel regions by gate dielectric material 203. The gate 201 may be included in a word line WL-CB.

As shown in the embodiment of FIG. 8, the selection components 220 and 224 and capacitor 205 of the memory cell 105 are vertically stacked, which may enable memory cells 105 to be packed to high levels of integration.

In some embodiments, the relative orientations of digit lines BL-CT and BL-CB are reversed so that the digit line BL-CT is over a supporting substrate 15 and the digit line BL-CB is over the digit line BL-CT. In such other embodiments the illustrated capacitors 205 would be inverted relative to the shown configuration of FIG. 8 and accordingly container shaped cell tops 230 would open upwardly instead of downwardly.

Figure 9:
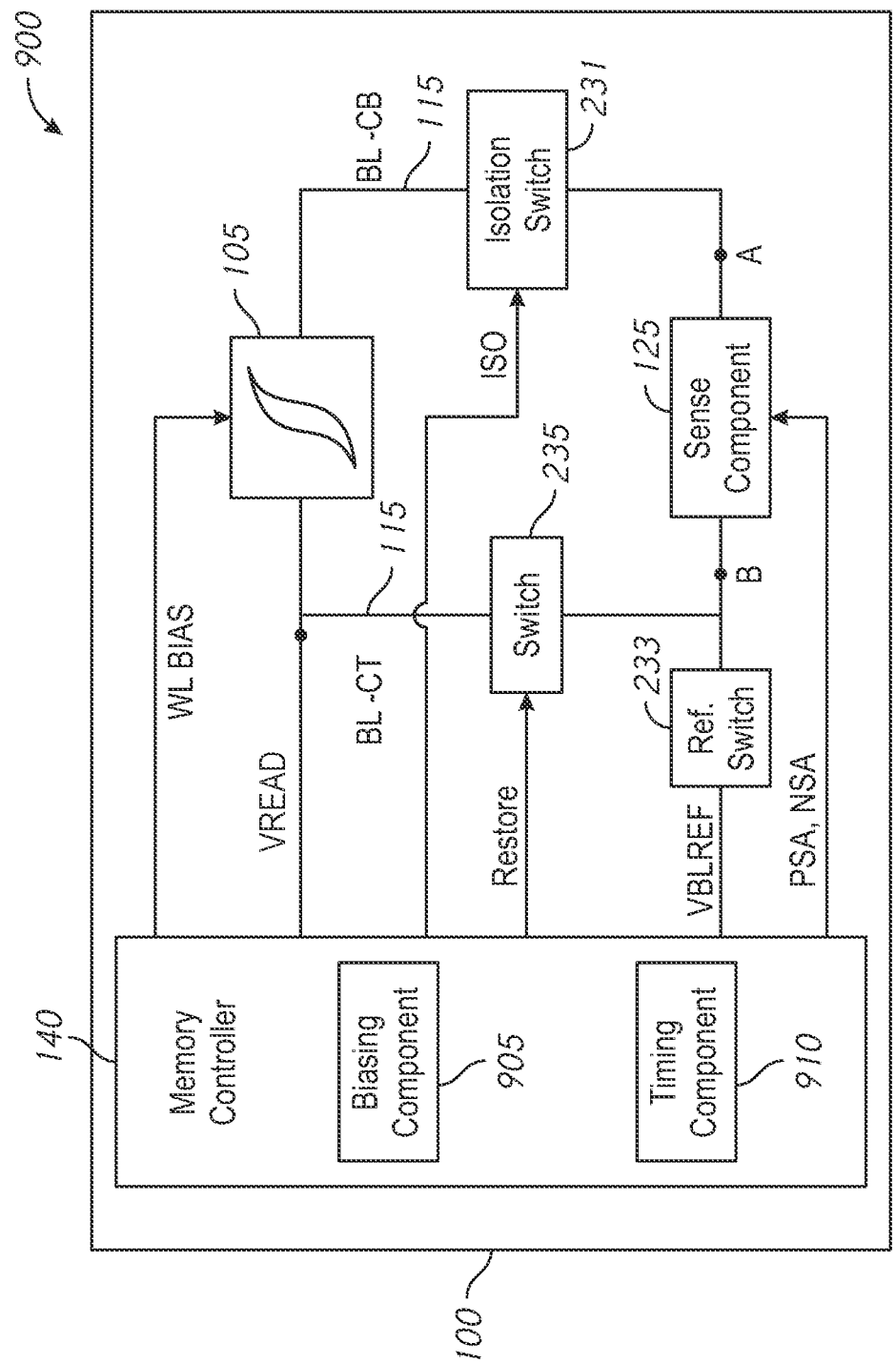
FIG. 9 is a block diagram of a memory array that supports a ferroelectric memory in accordance with various embodiments of the present disclosure.

FIG. 9 illustrates a block diagram of a portion of memory 900 that includes memory array 100 that supports a ferroelectric memory in accordance with various embodiments of the present disclosure. Memory array 100 may be referred to as an electronic memory apparatus and includes memory controller 140 and memory cell 105, which may be examples of memory controller 140 and memory cell 105 described with reference to FIG. 1, 2, or 4-7.

Memory controller 140 may include biasing component 905 and timing component 910, and may operate memory array 100 as described in FIG. 1. Memory controller 140 may be in electronic communication with word lines 110, digit lines 115, and sense component 125, which may be examples of word line 110, digit line 115, and sense component 125 described with reference to FIG. 1, 2, or 4-7. Memory controller 140 may also be in electronic communication with reference switch 233, isolation switch 231, and switch 235, which may be examples of the reference switch 233, isolation switch 231, and switch 235, respectively, described with reference to FIG. 2 or 4-7. Memory controller 140 may provide a reference signal VBLREF to the sense component 125 through the reference switch 233. The components of memory array 100 may be in electronic communication with each other and may perform the functions described with reference to FIGS. 1-7.

Memory controller 140 may be configured to activate word lines 110 or digit lines 115 by applying voltages to the word and digit lines. For example, biasing component 905 may be configured to apply a voltage to operate memory cell 105 to read or write memory cell 105 as described above. In some cases, memory controller 140 may include a row decoder, column decoder, or both, as described with reference to FIG. 1. This may enable memory controller 140 to access one or more memory cells 105. Biasing component 905 may also provide a reference signal VBLREF to sense component 125. Additionally, biasing component 905 may provide voltage potentials for the operation of sense component 125. 10881 Memory controller 140 may activate isolation switch 231 based on receiving the access operation request for the ferroelectric memory cell 105—that is, memory controller 140 may electrically connect memory cell 105 to sense component 125. Memory controller 140 may further determine a logic state of the ferroelectric memory cell 105 based on activating sense component 125, and write the logic state of the ferroelectric memory cell 105 back to the ferroelectric memory cell 105.

In some cases, memory controller 140 may perform its operations using timing component 910. For example, timing component 910 may control the timing of the various word line selections or cell top biasing, including timing for switching and voltage application to perform the memory functions, such as reading and writing, discussed herein. In some cases, timing component 910 may control the operations of biasing component 905.

Sense component 125 may compare a signal from memory cell 105 (through digit line 115) with the voltage of a reference signal VBLREF. The reference signal VBLREF may have a voltage with a value between the two sense voltages, as described with reference to FIGS. 2, 4A, and 4B. Upon determining the logic state, the sense component 125 may latch the output, where it may be used in accordance with the operations of an electronic device that memory array 100 is a part.

Figure 10:
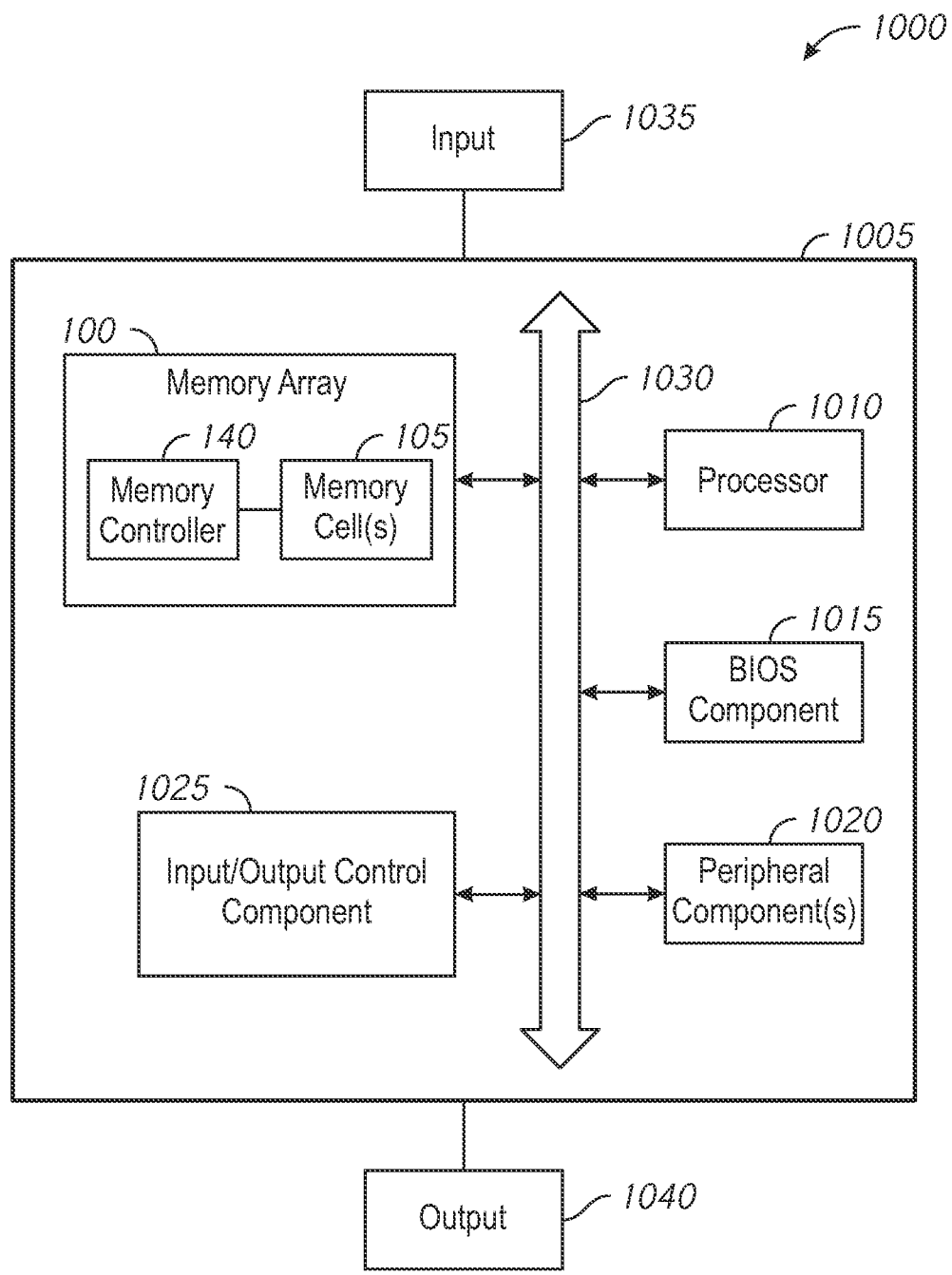
FIG. 10 is a block diagram of a system that supports a ferroelectric memory in accordance with various embodiments of the present disclosure.

FIG. 10 illustrates a system 1000 that supports a ferroelearic memory in accordance with various embodiments of the present disclosure. System 1000 includes a device 1005, which may be or include a printed circuit board to connect or physically support various components. Device 1005 may be a computer, notebook computer, laptop, tablet computer, mobile phone, or the like. Device 1005 includes a memory array 100, which may be an example of memory array 100 as described with reference to FIGS. 1 and 9. Memory array 100 may contain memory controller 140 and memory cell(s) 105, which may be examples of memory controller 140 described with reference to FIGS. 1 and 9 and memory cells 105 described with reference to FIGS. 1, 2, and 4-9. Device 1005 may also include a processor 1010, BIOS component 1015, peripheral component(s) 1020, and input/output control component 1025. The components of device 1005 may be in electronic communication with one another through bus 1030.

Processor 1010 may be configured to operate memory array 100 through memory controller 140. In some cases, processor 1010 may perform the functions of memory controller 140 described with reference to FIGS. 1 and 9. In other cases, memory controller 140 may be integrated into processor 1010. Processor 1010 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. The processor 1010 may perform various functions and operate the memory array 100 as described herein. Processor 1010 may, for example, be configured to execute computer-readable instructions stored in memory array 100 to cause device 1005 perform various functions or tasks.

BIOS component 1015 may be a software component that includes a basic input/output system (BIOS) operated as firmware, which may initialize and run various hardware components of system 1000. BIOS component 1015 may also manage data flow between processor 1010 and the various components, e.g., peripheral components 1020, input/output control component 1025, etc. BIOS component 1015 may include a program or software stored in read-only memory (ROM), flash memory, or any other non-volatile memory.

Peripheral component(s) 1020 may be any input or output device, or an interface for such devices, that is integrated into device 1005. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1025 may manage data communication between processor 1010 and peripheral component(s) 1020, input devices 1035, or output devices 1040. Input/output control component 1025 may also manage peripherals not integrated into device 1005. In some cases, input/output control component 1025 may represent a physical connection or port to the external peripheral.

Input 1035 may represent a device or signal external to device 1005 that provides input to device 1005 or its components. This may include a user interface or interface with or between other devices. In some cases, input 1035 may be a peripheral that interfaces with device 1005 via peripheral component(s) 1020 or may be managed by input/output control component 1025.

Output 1040 may represent a device or signal external to device 1005 configured to receive output from device 1005 or any of its components. Examples of output 1040 may include a display, audio speakers, a printing device, another processor or printed circuit board, etc. In some cases, output 1040 may be a peripheral that interfaces with device 1005 via peripheral component(s) 1020 or may be managed by input/output control component 1025.

The components of memory controller 140, device 1005. and memory array 100 may be made up of circuitry designed to carry out their functions. This may include various circuit elements, for example, conductive lines, transistors, capacitors, inductors, resistors, amplifiers, or other active or inactive elements, configured to carry out the functions described herein.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. A method, comprising:
   coupling a first plate of a memory capacitor to a first digit line;
   coupling a second plate of the memory capacitor to a second digit line;
   applying an amplified voltage difference to the first and second plates of the memory capacitor over the first and second digit lines, respectively; and
   deactivating respective first and second word lines coupled to respective activated first and second selection components that are each coupled to the memory capacitor.

2. The method of claim 1, wherein applying the amplified voltage difference to the first and second plates of the memory capacitor over the first and second digit lines, respectively comprises:
   latching, at a sense component, the amplified voltage difference.

3. The method of claim 2, further comprising:
   responsive to latching the amplified voltage difference, deactivating the sense component; and wherein deactivating the respective first and second word lines comprises responsive to deactivation of the sense component, deactivating the respective first and second word lines to complete a write operation performed at the memory capacitor.

4. The method of claim 1, further comprising:
   deactivating a driver providing a read voltage; and
   responsive to the driver being deactivated, activating a restore switch to couple the first digit line to a first sense node of a sense component.

5. The method of claim 4, wherein activating the restore switch coupled between the first digit line and the first sense node comprises restoring a charge of the memory capacitor.

6. The method of claim 1, wherein applying the amplified voltage difference to the first and second plates of the memory capacitor over the first and second digit lines, respectively causes a respective change in voltage at the first and second plates of the memory capacitor.

7. The method of claim 1, wherein the amplified voltage difference is representative of a logical value to be stored in the memory capacitor.

8. The method of claim 7, wherein the logical value to be stored in the memory capacitor corresponds to a logic '1' or a logic '0'.

9. The method of claim 1, wherein the memory capacitor comprises a ferroelectric memory capacitor.

10. The method of claim 9, wherein the ferroelectric memory capacitor is configured to change polarization in accordance with a logical value to be stored in the same.

11. A method, comprising:
activating respective first and second word lines coupled to respective activated first and second selection components that are each coupled to a ferroelectric memory capacitor of a memory cell;
amplifying, by a write amplifier, first and second sense nodes of a sense component;
responsive to the amplifying at first and second sense nodes of the sense component, changing respective voltages at first and second cell plates of the ferroelectric memory capacitor; and
deactivating the respective first and second word lines coupled to the respective activated first and second selection components to complete a write operation performed on the memory cell.

12. The method of claim 11, wherein a voltage of the second cell plate of the ferroelectric memory capacitor changes responsive to a voltage of the first cell plate changing for a polarization of the ferroelectric memory capacitor.

13. The method of claim 11, wherein changing the respective voltages at the respective cell plates of the ferroelectric memory capacitor comprises:
driving the first and second sense nodes of the sense component; and
changing voltages at first and second digit lines coupled, respectively, to the first and second nodes and the respective activated first and second selection components.

14. The method of claim 13, further comprising:
deactivating an isolation switch coupled between the second digit line and the second sense node;
driving the first sense node to a first voltage and driving the second sense node to a second voltage responsive to the first voltage of the first sense node being greater than the second voltage of the second sense node; and
driving the first sense node to the second voltage and driving the second sense node to the first voltage responsive to the first voltage of the first sense node being less than the second voltage of the second sense node.

15. The method of claim 14, further comprising:
providing a constant voltage to the first sense node as a reference voltage.

16. The method of claim 14, further comprising:
activating a restore switch and an isolation switch to couple the sense nodes of the sense component to bit lines coupled to the respective activated first and selection components; and wherein responsive to activating the restore switch and the isolation switch, activating the respective first and second word lines to perform the write operation on the memory cell.

17. The method of claim 11, wherein the voltage of the first sense node is greater than the voltage of the second sense node when the capacitor has a first polarization, and wherein the voltage of the first sense node is less than the voltage of the second sense node when the capacitor has a second polarization different than the first polarization.

18. The method of claim 11, further comprising:
applying an amplified voltage difference to the first and second cell plates of the ferroelectric memory capacitor over first and second digit lines, respectively; and
latching, at a sense component, the amplified voltage difference.

19. The method of claim 18, further comprising:
responsive to latching the amplified voltage difference, deactivating the sense component.

20. The method of claim 18, wherein the amplified voltage difference is representative of a logical value to be written to the ferroelectric memory capacitor of the memory cell.

* * * * *